US010269709B2

(12) United States Patent
Lee

(10) Patent No.: US 10,269,709 B2
(45) Date of Patent: Apr. 23, 2019

(54) SEMICONDUCTOR DEVICE AND MANUFACTURING METHOD THEREOF

(71) Applicant: SK hynix Inc., Icheon-si Gyeonggi-do (KR)

(72) Inventor: Nam Jae Lee, Cheongju-si Chungcheongbuk-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/891,192

(22) Filed: Feb. 7, 2018

(65) Prior Publication Data

US 2018/0166384 A1    Jun. 14, 2018

Related U.S. Application Data

(63) Continuation of application No. 15/131,935, filed on Apr. 18, 2016, now Pat. No. 9,929,093.

(30) Foreign Application Priority Data

Nov. 16, 2015   (KR) .................. 10-2015-0160676

(51) Int. Cl.
*H01L 23/522*    (2006.01)
*H01L 23/528*    (2006.01)
*H01L 27/11556*  (2017.01)
*H01L 27/11582*  (2017.01)
*H01L 27/11565*  (2017.01)
*H01L 27/11575*  (2017.01)

(52) U.S. Cl.
CPC ...... *H01L 23/5283* (2013.01); *H01L 23/5226* (2013.01); *H01L 27/11556* (2013.01); *H01L 27/11565* (2013.01); *H01L 27/11575* (2013.01); *H01L 27/11582* (2013.01)

(58) Field of Classification Search
CPC ............ H01L 23/5226; H01L 23/5283; H01L 27/11556; H01L 27/11565; H01L 27/11575; H01L 27/11582
USPC ...................... 257/40; 438/92, 99
See application file for complete search history.

(56) References Cited

U.S. PATENT DOCUMENTS

2011/0180866 A1   7/2011  Matsuda et al.
2012/0295409 A1   11/2012 Yun et al.
(Continued)

FOREIGN PATENT DOCUMENTS

KR   1020130142195 A   12/2013
KR   1020170014757 A   2/2017

OTHER PUBLICATIONS

Elliott Cho, Examiner Initiated Telephonic Interview, "PA2739-0_Response.docx", Aug. 22, 2017, 5 Pages.

*Primary Examiner* — Long K Tran
(74) *Attorney, Agent, or Firm* — William Park & Associates Ltd.

(57) ABSTRACT

A semiconductor device includes a substrate including a cell area, a first contact area, and a second contact area; a lower stacked structure extending over the second contact area from the cell area; an upper stacked structure extending over the first contact area from the cell area, the upper stacked structure leaving the second contact area open; N (N is a natural number of 2 or more) first group of stepped grooves penetrating at least one portion of the upper stacked structure in the first contact area; and M (M is a natural number equal to or smaller than N) second group of stepped grooves penetrating at least one portion of the lower stacked structure in the second contact area.

12 Claims, 34 Drawing Sheets

(56) References Cited

U.S. PATENT DOCUMENTS

2013/0059432 A1    3/2013   Lee et al.
2013/0153983 A1    6/2013   Jeon
2014/0167129 A1    6/2014   Kim
2015/0287739 A1   10/2015   Lee

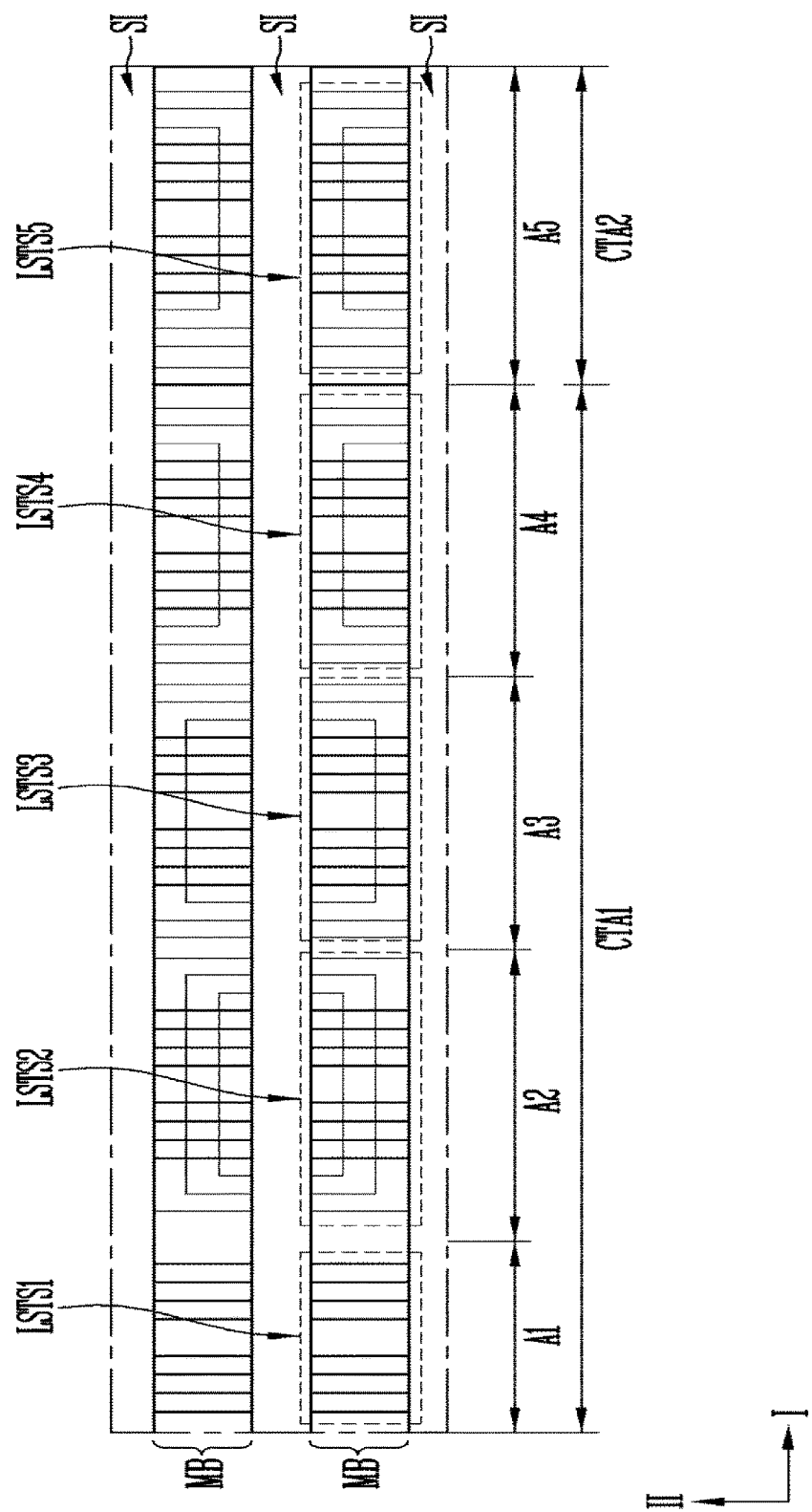

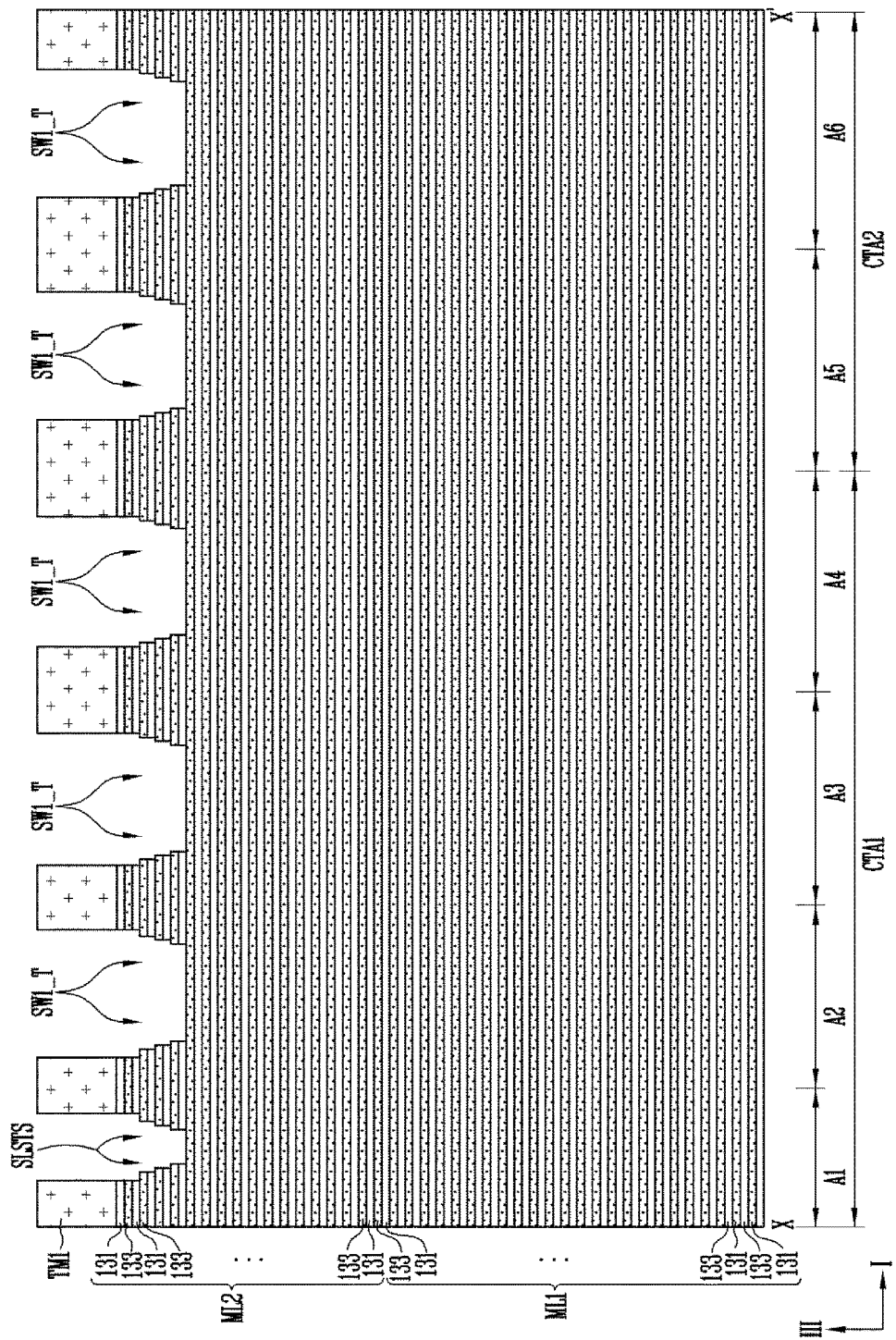

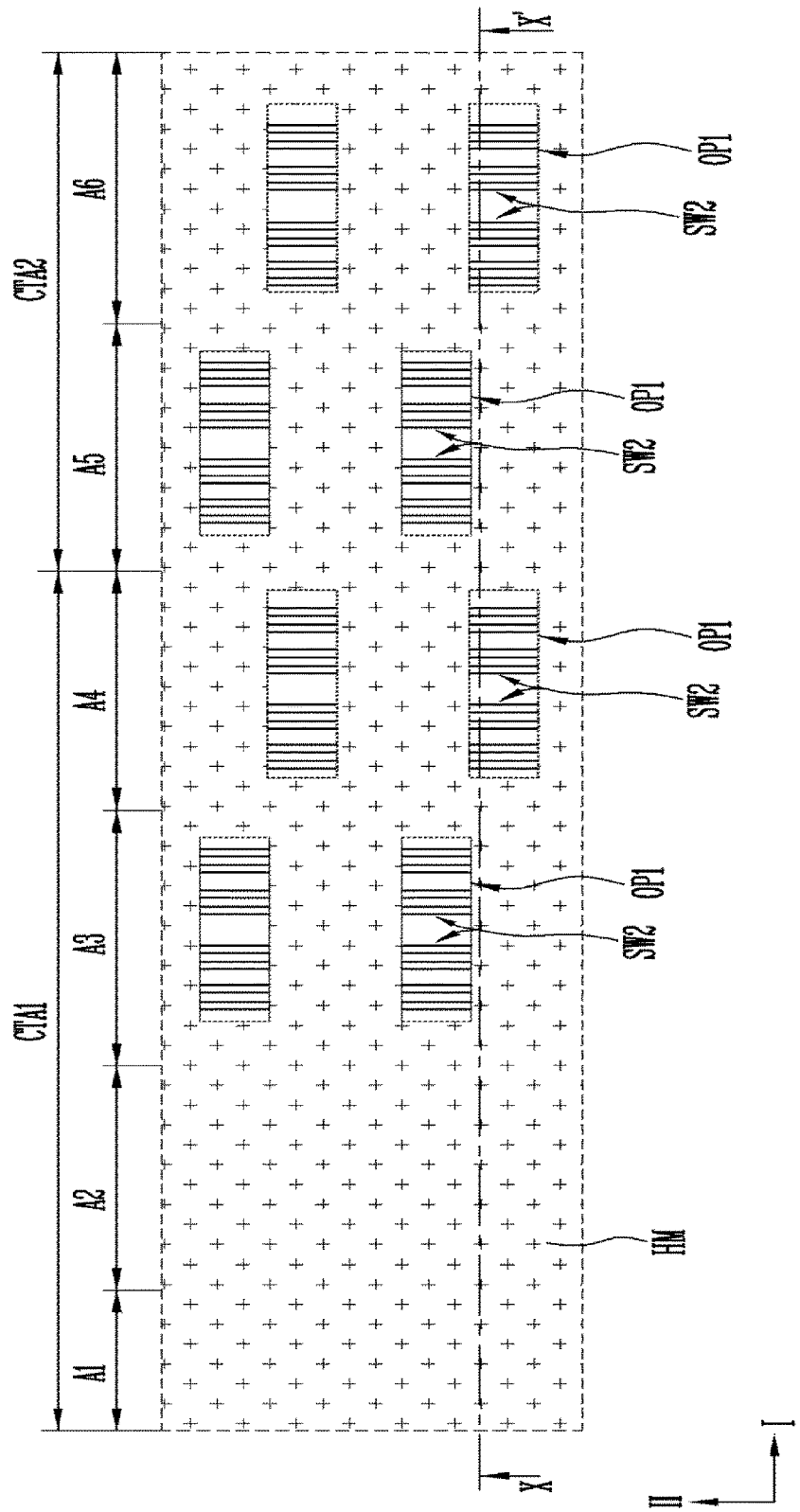

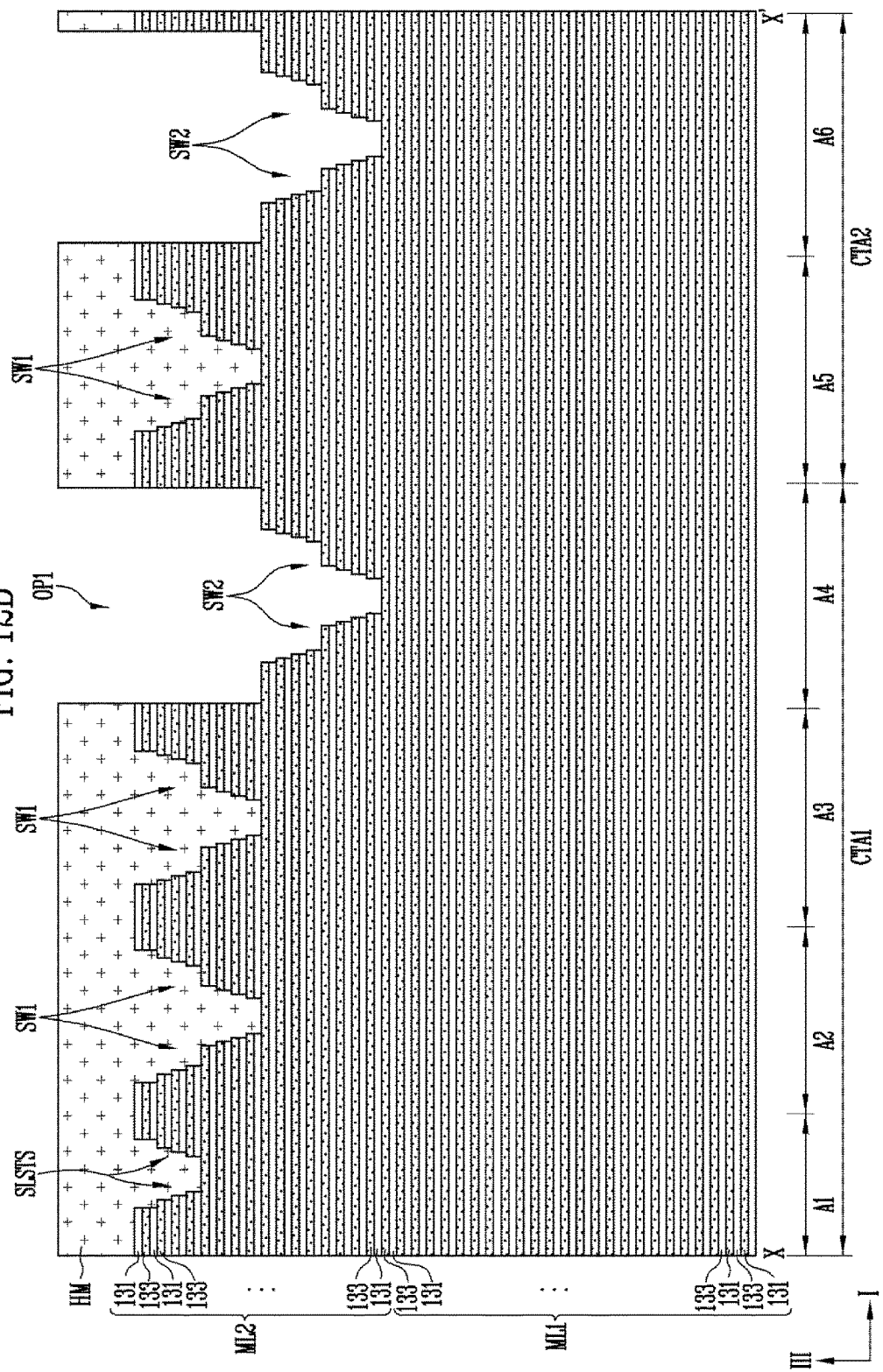

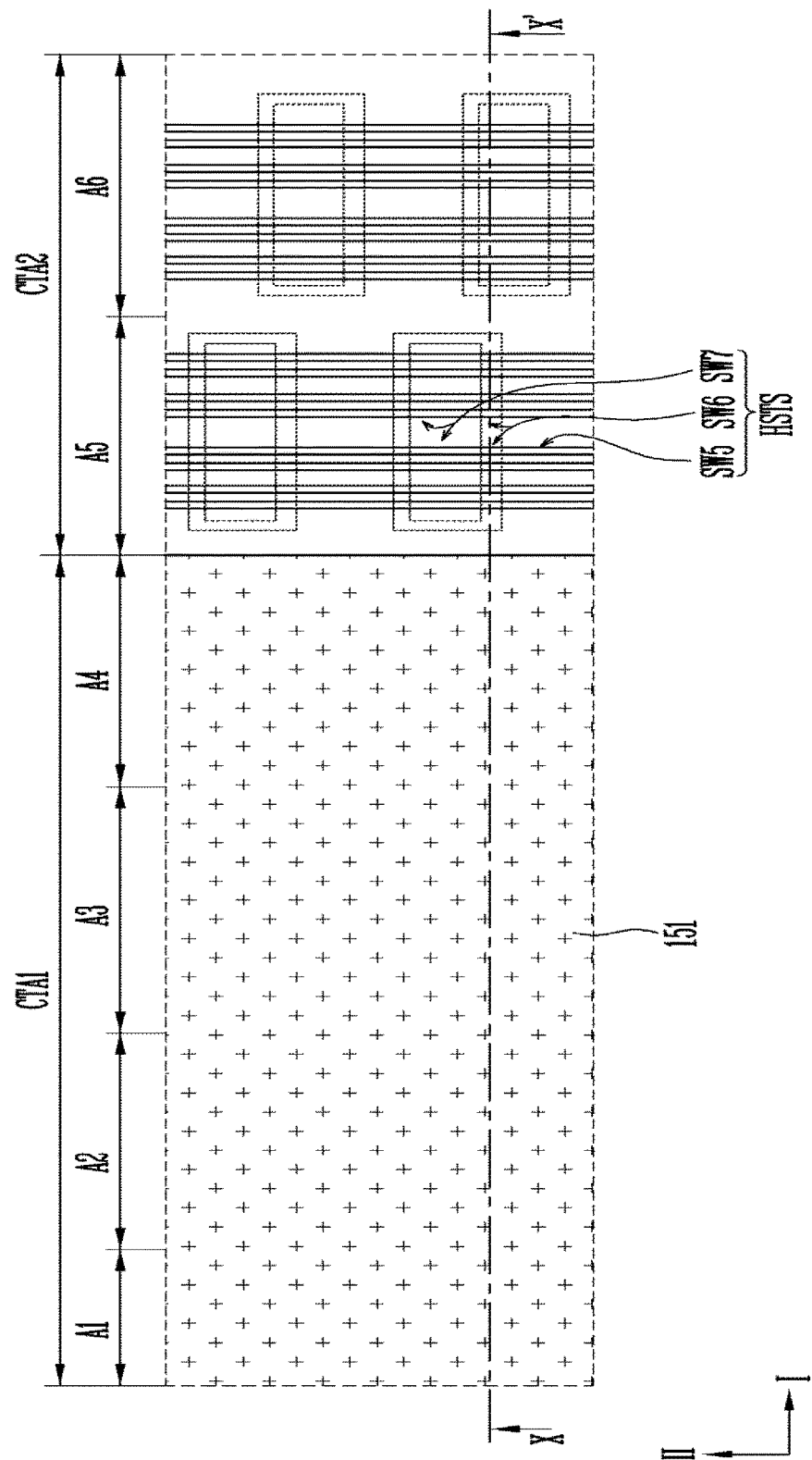

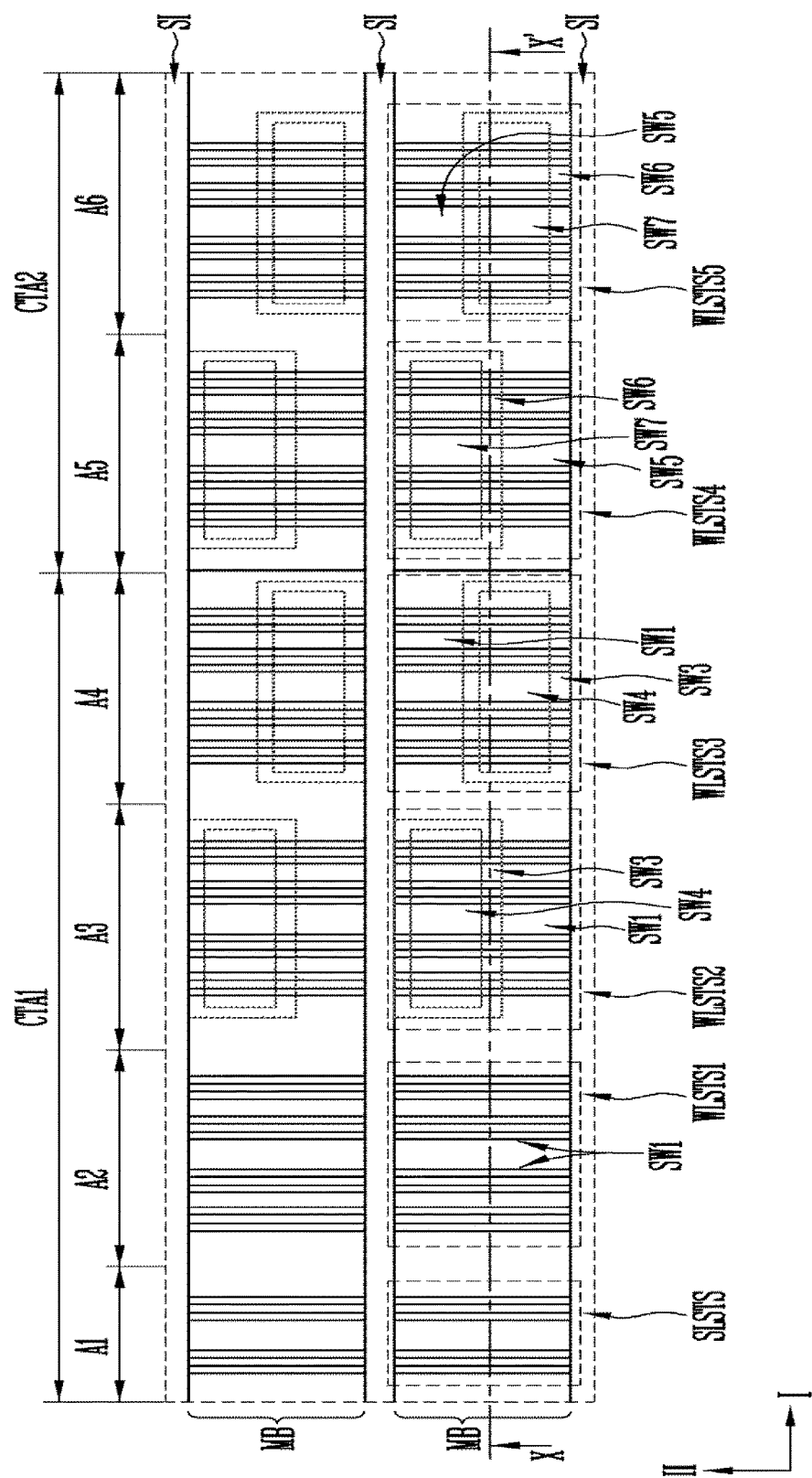

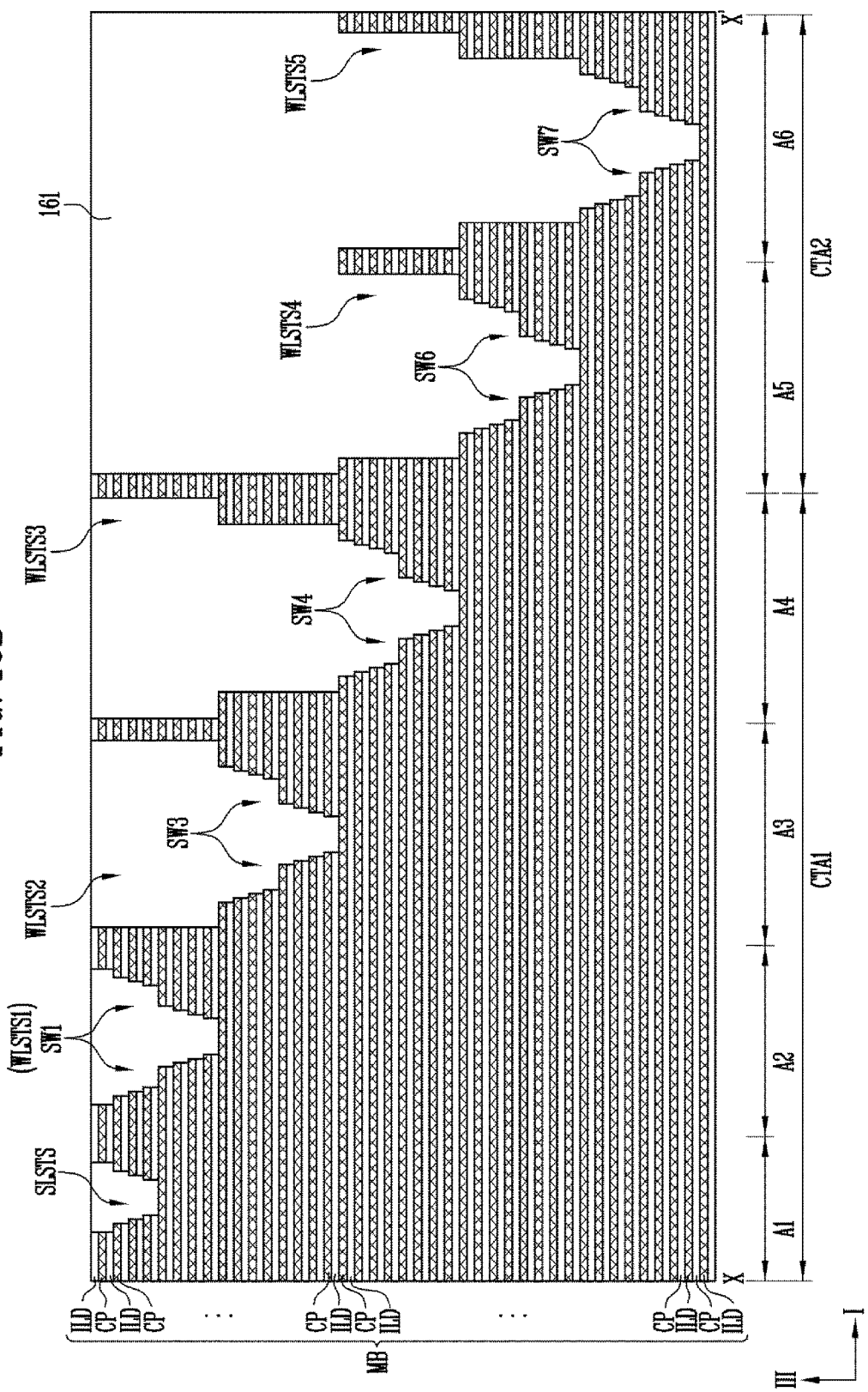

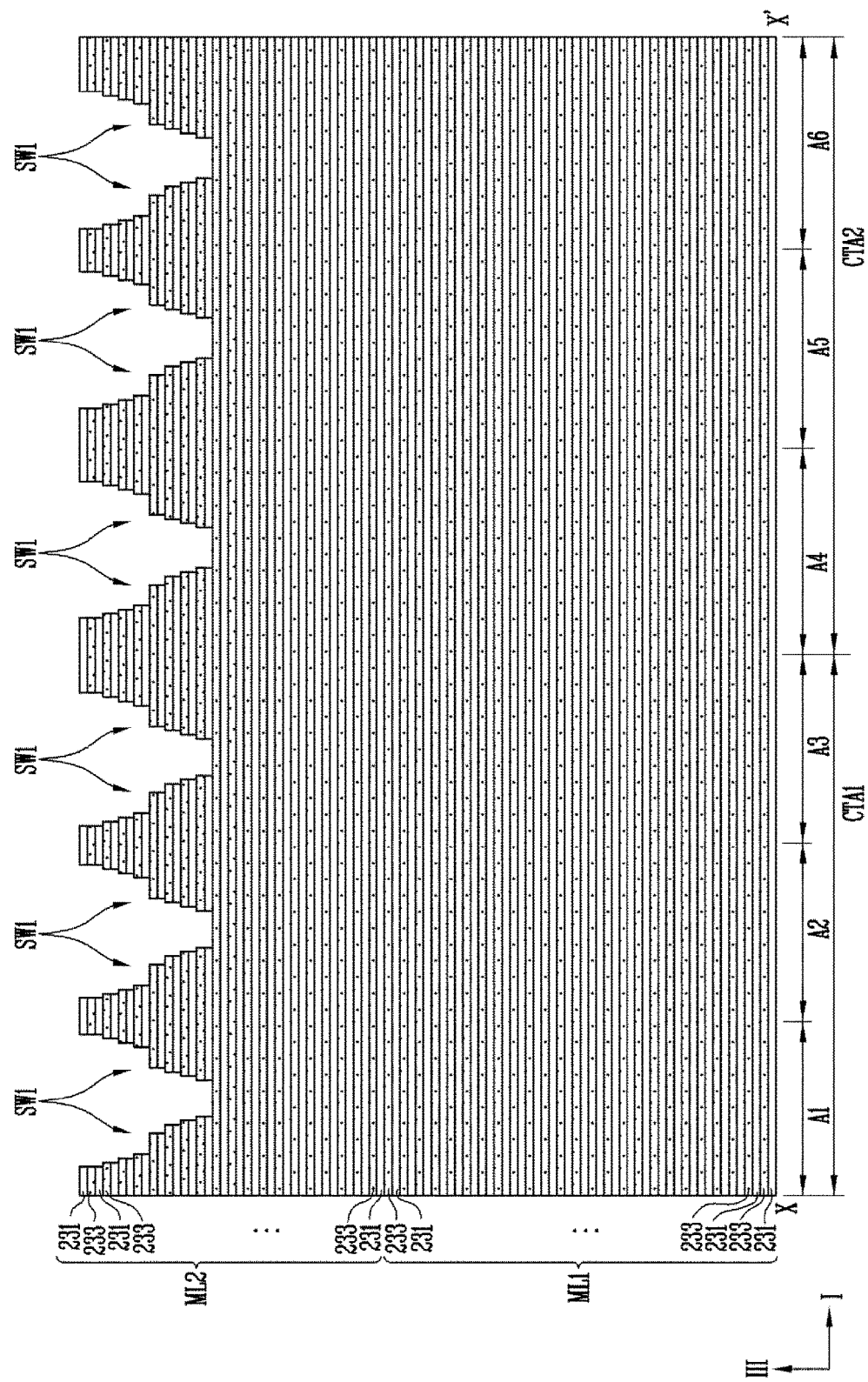

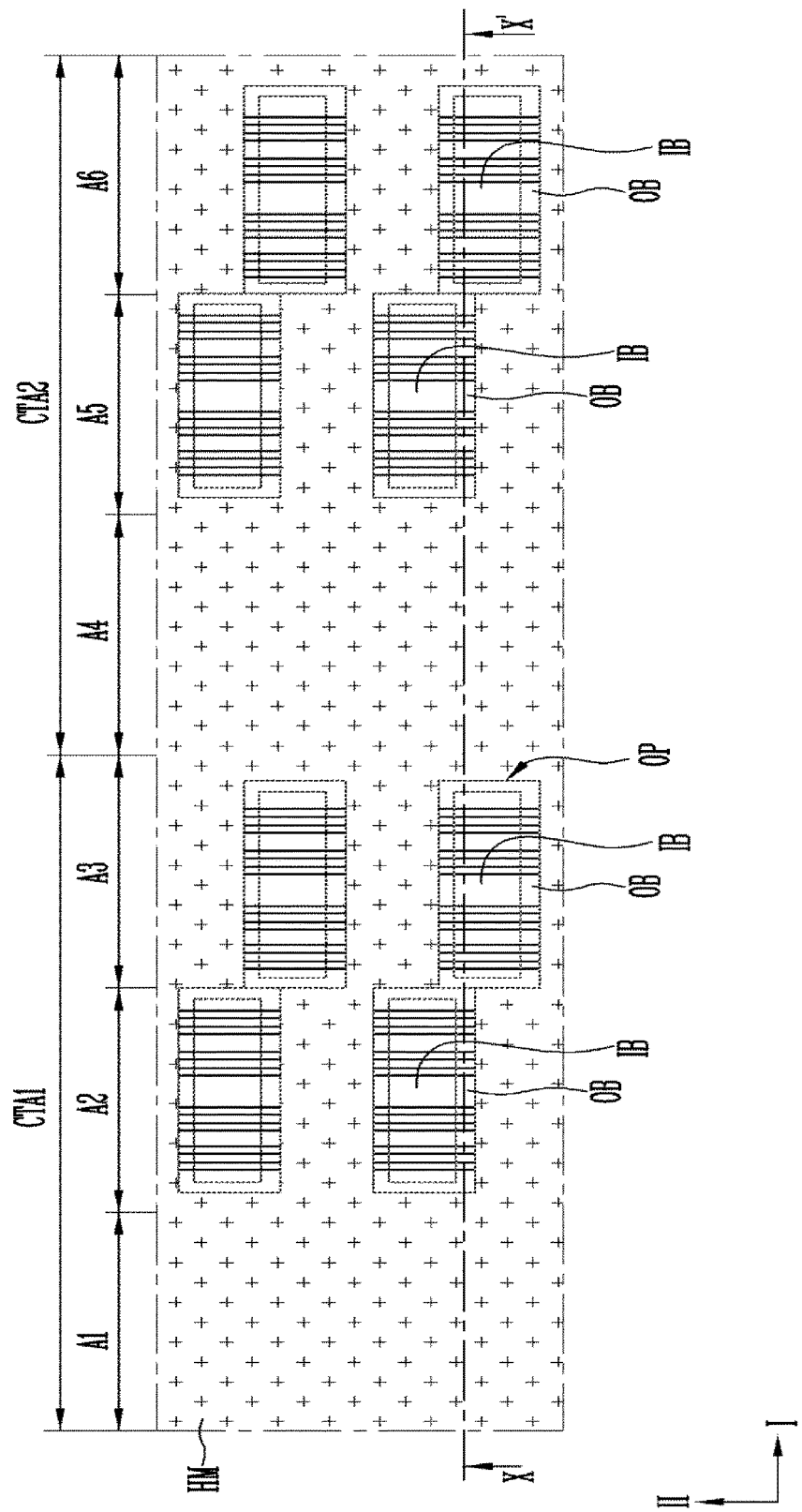

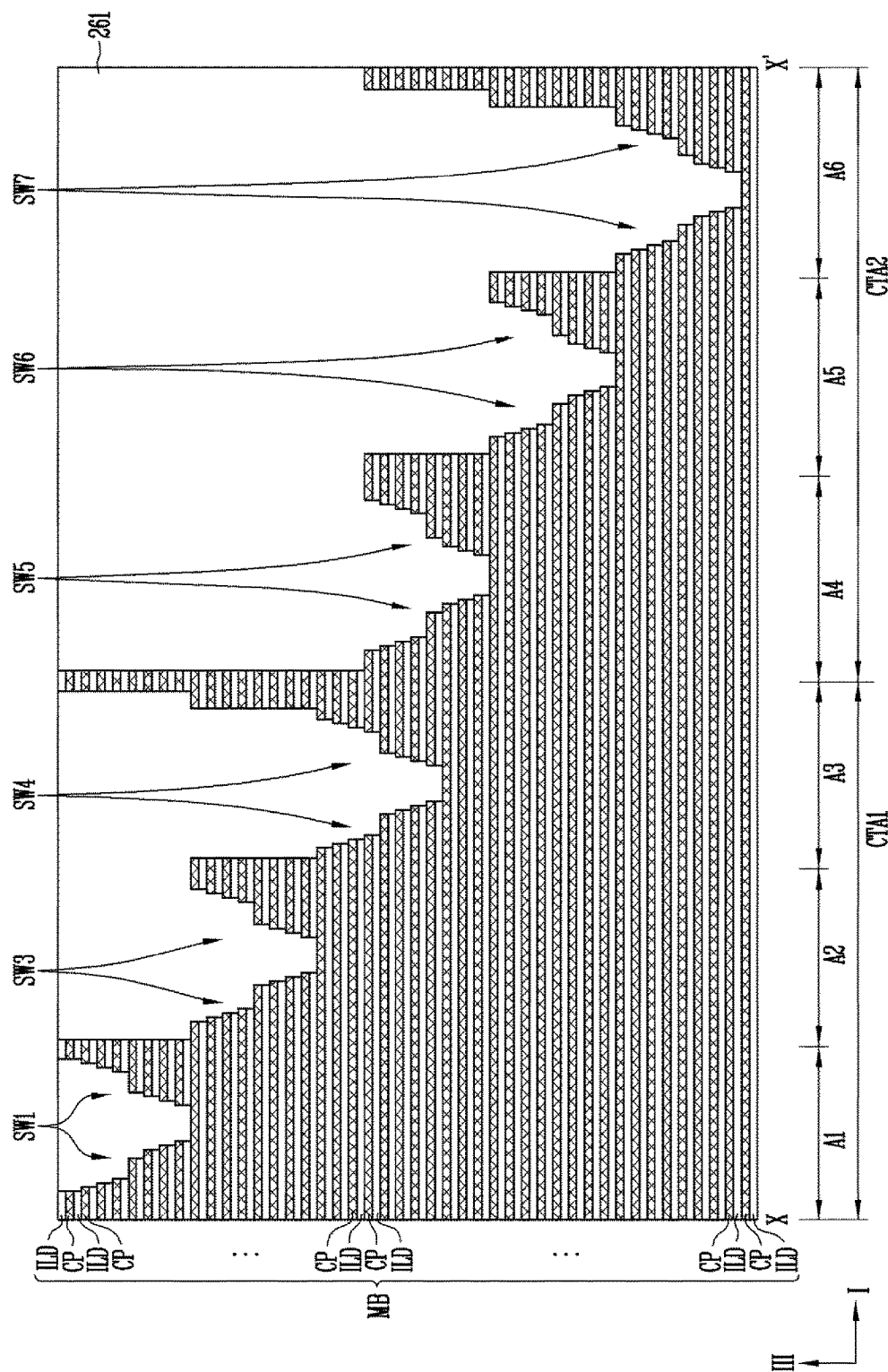

SEMICONDUCTOR DEVICE AND MANUFACTURING METHOD THEREOF

CROSS-REFERENCE TO RELATED APPLICATION

The present application is a continuation application of U.S. application Ser. No. 15/131,935, filed on Apr. 18, 2016, and claims priority under 35 U.S.C. § 119(a) to Korean patent application number 10-2015-0160676, filed on Nov. 16, 2015, the entire disclosure of which is incorporated herein in its entirety by reference.

BACKGROUND

1. Technical Field

An aspect of the present disclosure relates to a semiconductor device and a manufacturing method thereof, and more particularly, to a semiconductor device having a multi-layered structure and a manufacturing method thereof.

2. Related Art

A semiconductor device includes a memory device capable of storing data. The memory device may include memory strings. Each of the memory strings includes memory cells connected in series to each other.

A three-dimensional memory device has been proposed in order to improve the degree of integration of the memory string. Memory cells of the three-dimensional memory device are three-dimensionally arranged over a substrate. The three-dimensional memory device includes a multi-layered structure. The multi-layered structure includes conductive patterns arranged at different heights. The conductive patterns are connected to the memory cells. In order to independently apply an electrical signal to the conductive patterns arranged at different heights, contact plugs should be connected to the conductive patterns, respectively.

SUMMARY

According to an aspect of the present disclosure, there is provided a semiconductor device including: a substrate including a cell area, a first contact area extending along a first direction from the cell area, and a second contact area extending along the first direction from the first contact area; a lower stacked structure extending over the second contact area from the cell area, the lower stacked structure including first interlayer insulating layers and first conductive patterns, which are alternately stacked over the substrate; an upper stacked structure extending over the first contact area from the cell area, the upper stacked structure leaving the second contact area open, the upper stacked structure including second interlayer insulating layers and second conductive patterns, which are alternately stacked on the lower stacked structure; N (N is a natural number of 2 or more) first group of stepped grooves penetrating at least one portion of the upper stacked structure in the first contact area, the N first group of stepped grooves each having stepped sidewalls symmetrically opposite to each other in the first direction; and M (M is a natural number equal to or smaller than N) second group of stepped grooves penetrating at least one portion of the lower stacked structure in the second contact area, the M second group of stepped grooves each having stepped sidewalls symmetrically opposite to each other in the first direction.

According to an aspect of the present disclosure, there is provided a method of manufacturing a semiconductor device, the method including: forming a first stacked group over a substrate, wherein the substrate includes a cell area, a first contact area extending along a first direction from the cell area, and a second contact area extending along the first direction from the first contact area; forming a second stacked group on the first stacked group; forming stepped trenches by etching the second stacked group, wherein the stepped trenches are arranged in a line along the first direction and each includes first stepped sidewalls symmetrically opposite to each other in the first direction, the first stepped sidewalls having a first depth; etching the second stacked group to have a depression structure in which at least one of the stepped trenches is depressed in stages to a second depth deeper than the first depth and a third depth deeper than the second depth on the first and second contact areas; and etching the first and second stacked groups such that the stepped trenches including the depression structure are moved to the inside of the first stacked group in the second contact area, and the second stacked group is removed in the second contact area.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey a scope of example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Embodiments provide a semiconductor device provided with an area in which contact plugs can be connected to a multi-layered structure and a manufacturing method of the semiconductor device.

Figure 1:
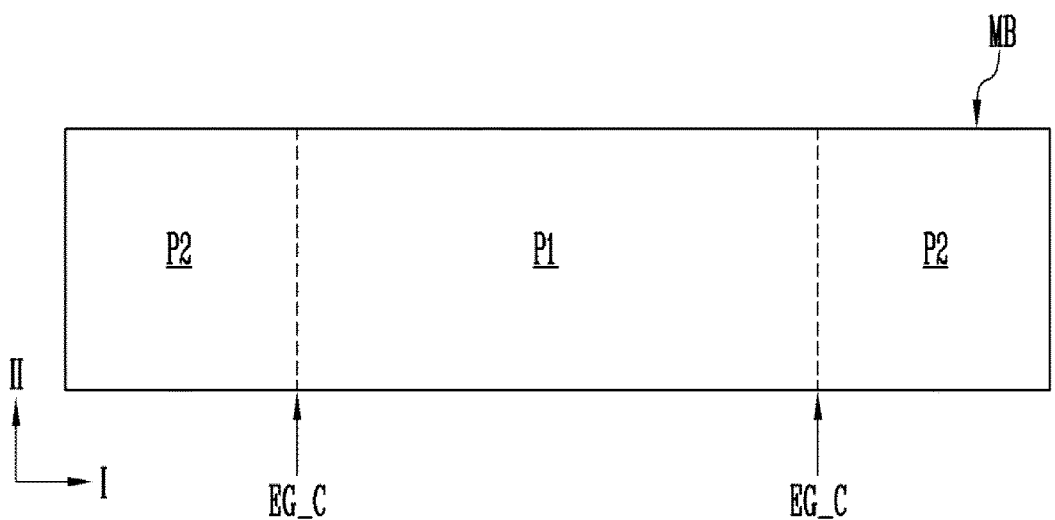

FIG. 1 is a view illustrating a cell area and a contact area of a semiconductor device according to an embodiment of the present disclosure.

Figure 2A:
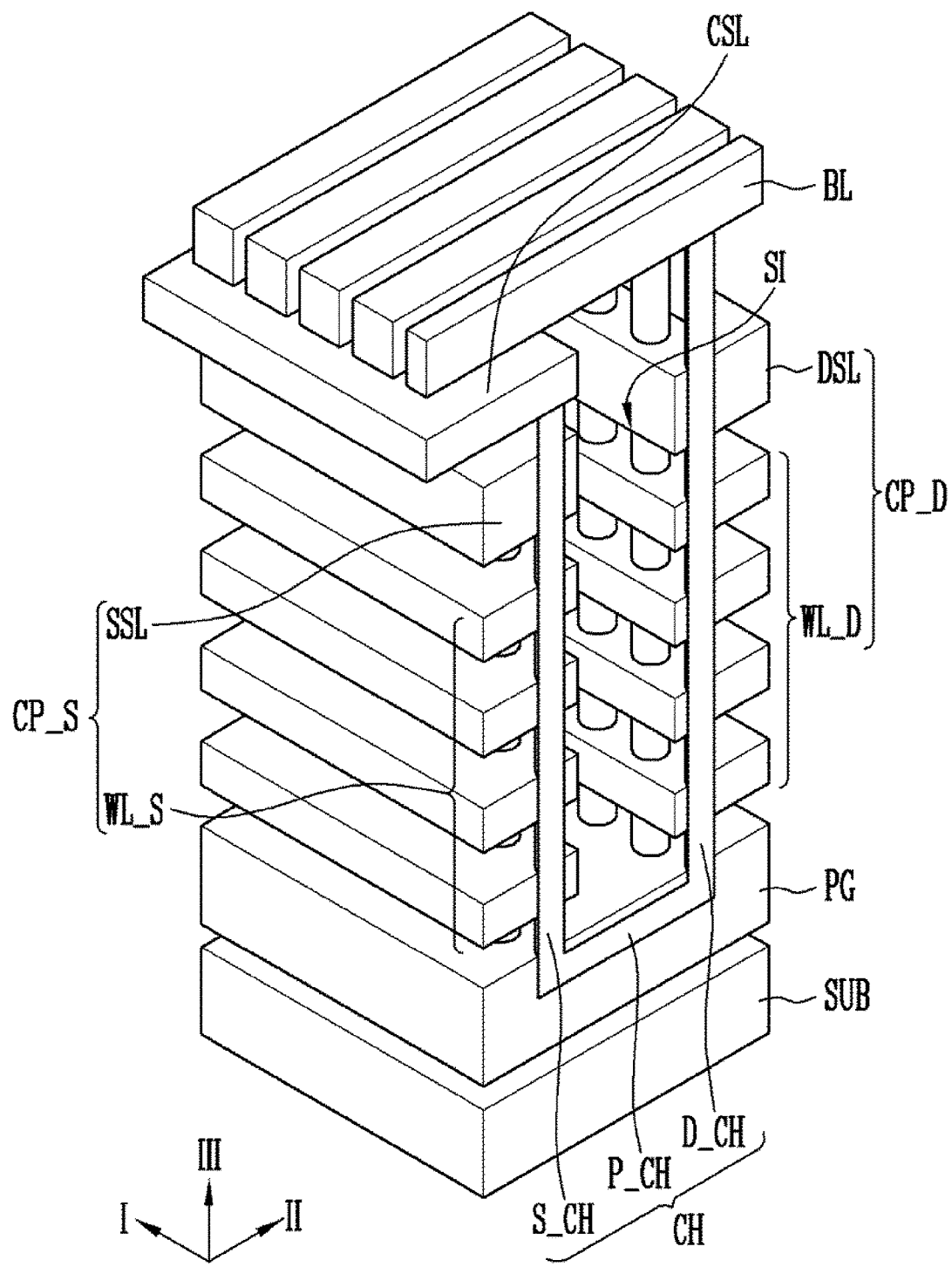
Figure 2B:
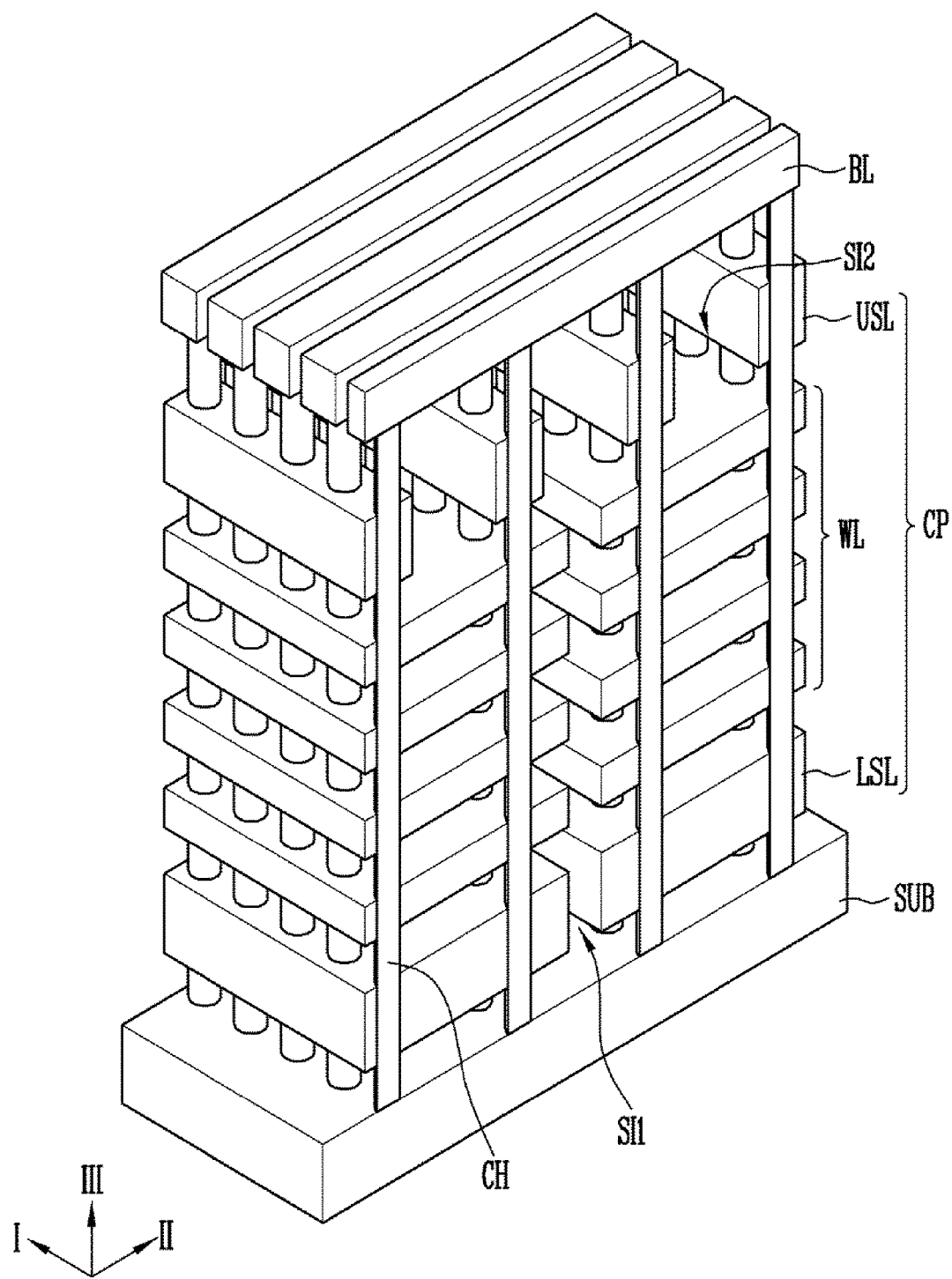

FIGS. 2A and 2B are perspective views illustrating structures of memory strings of semiconductor devices according to embodiments of the present disclosure.

Figure 3:
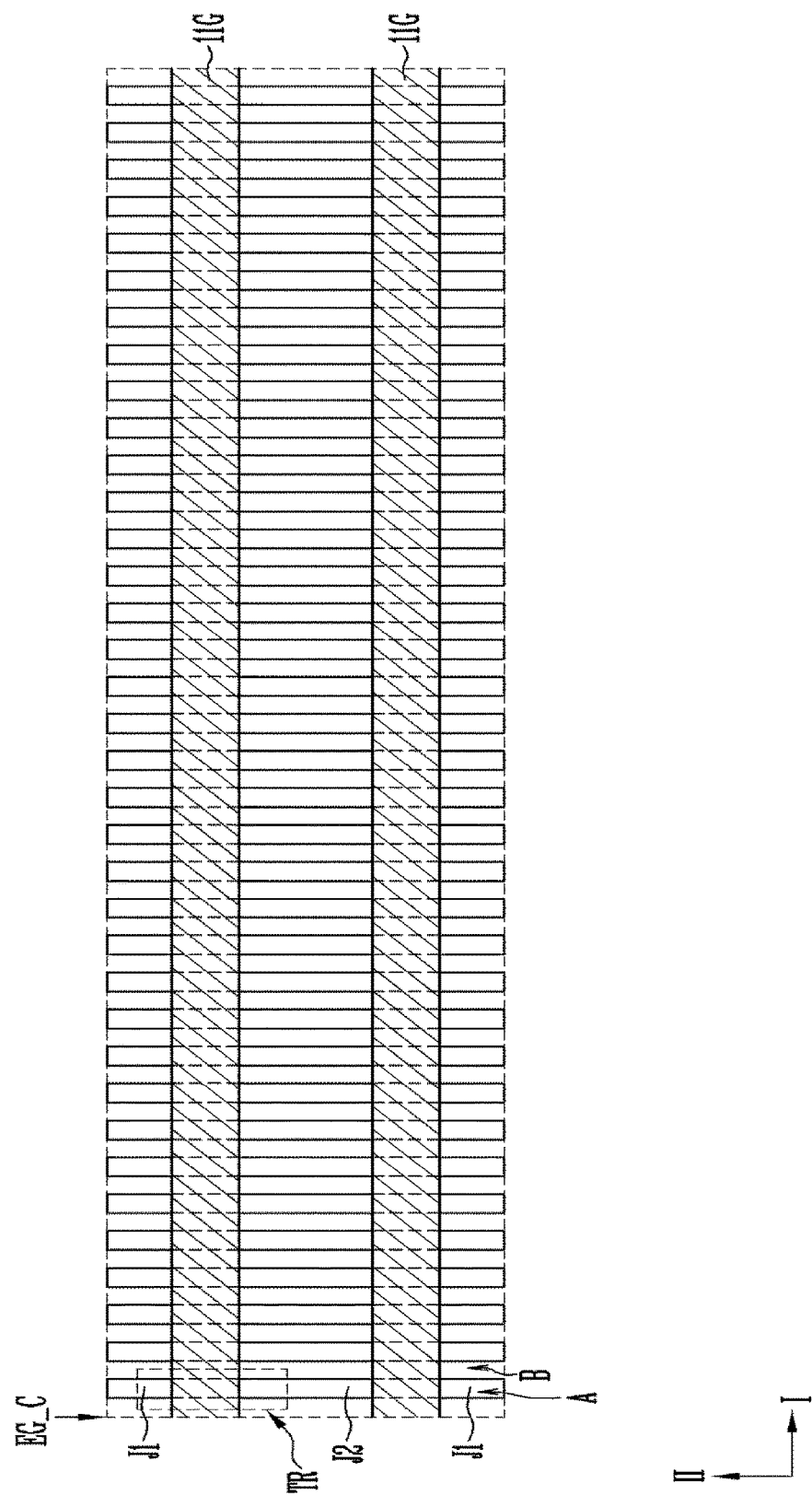

FIG. 3 is a plan view illustrating a pass transistor according to an embodiment of the present disclosure.

Figure 4A:
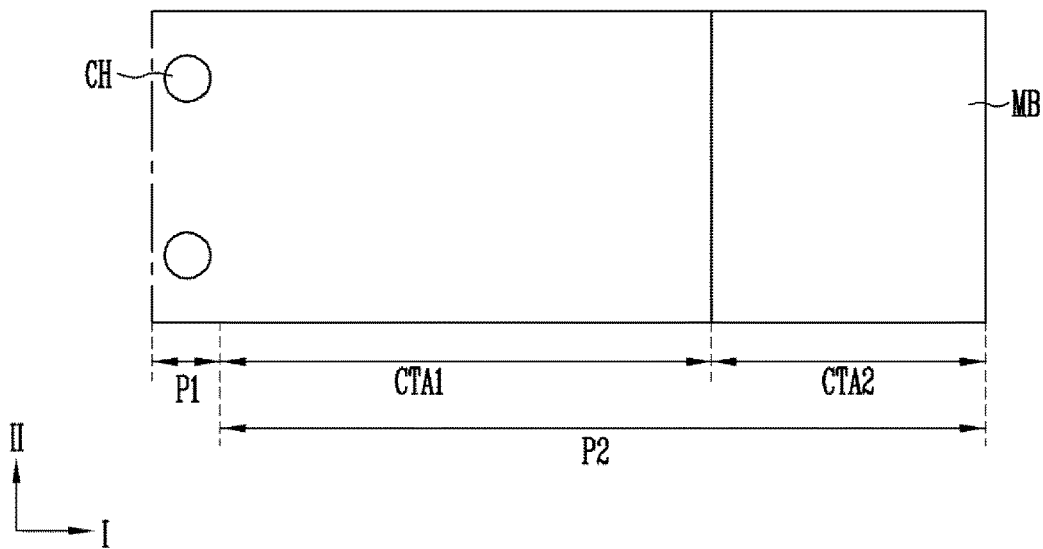
Figure 4B:
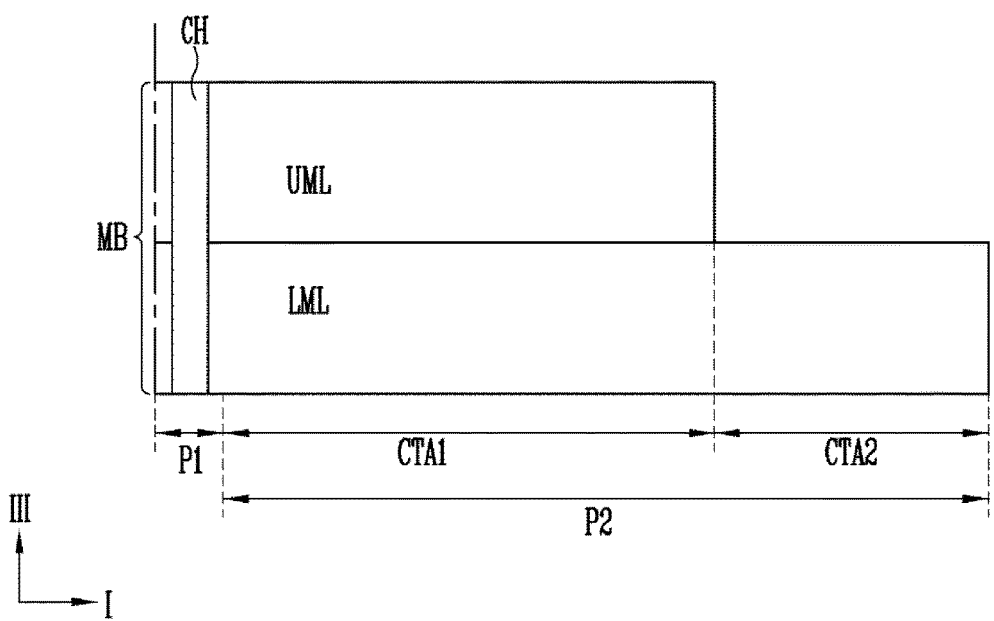

FIGS. 4A and 4B are plan and sectional views schematically illustrating a contact area in a semiconductor device according to an embodiment of the present disclosure.

Figure 5A:
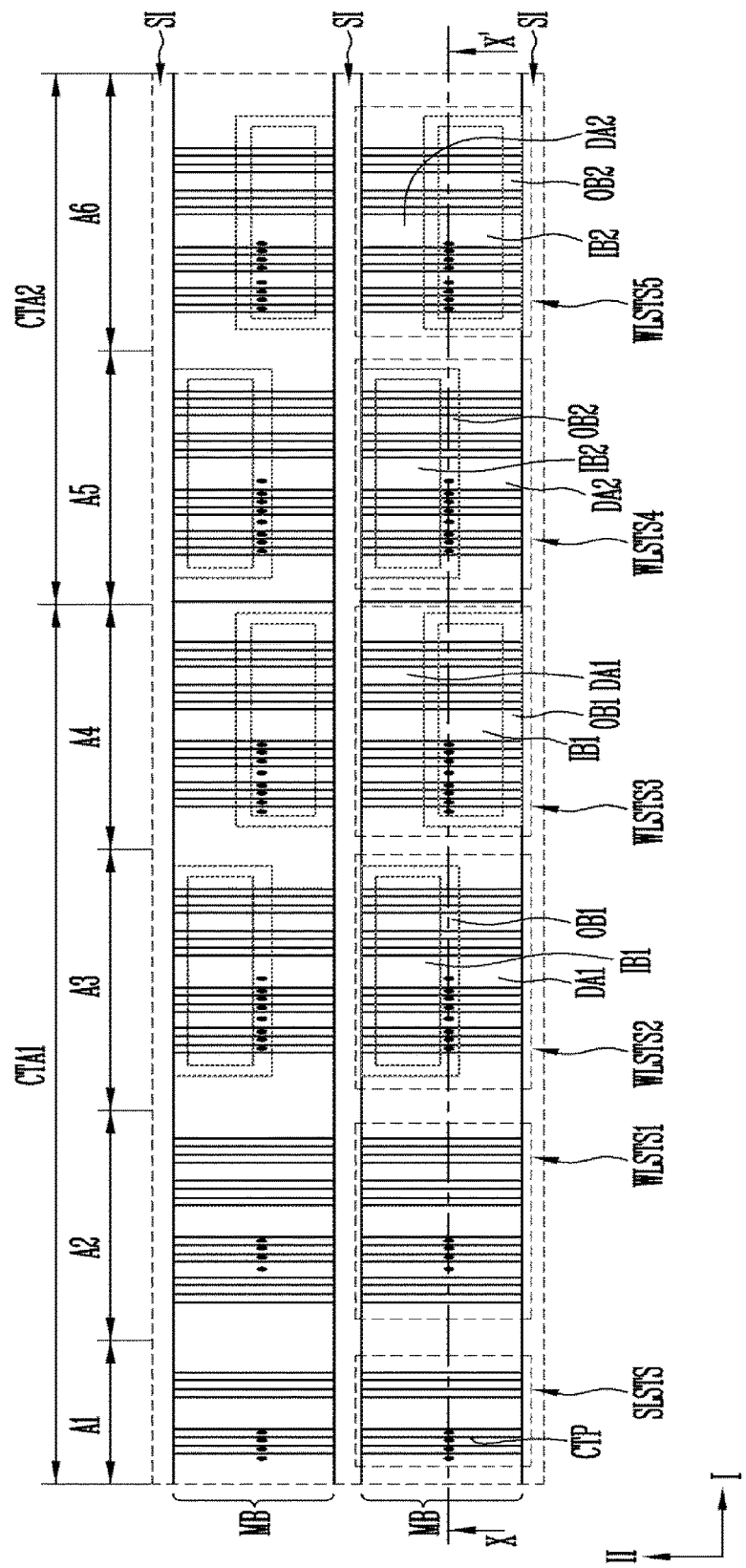
Figure 5B:
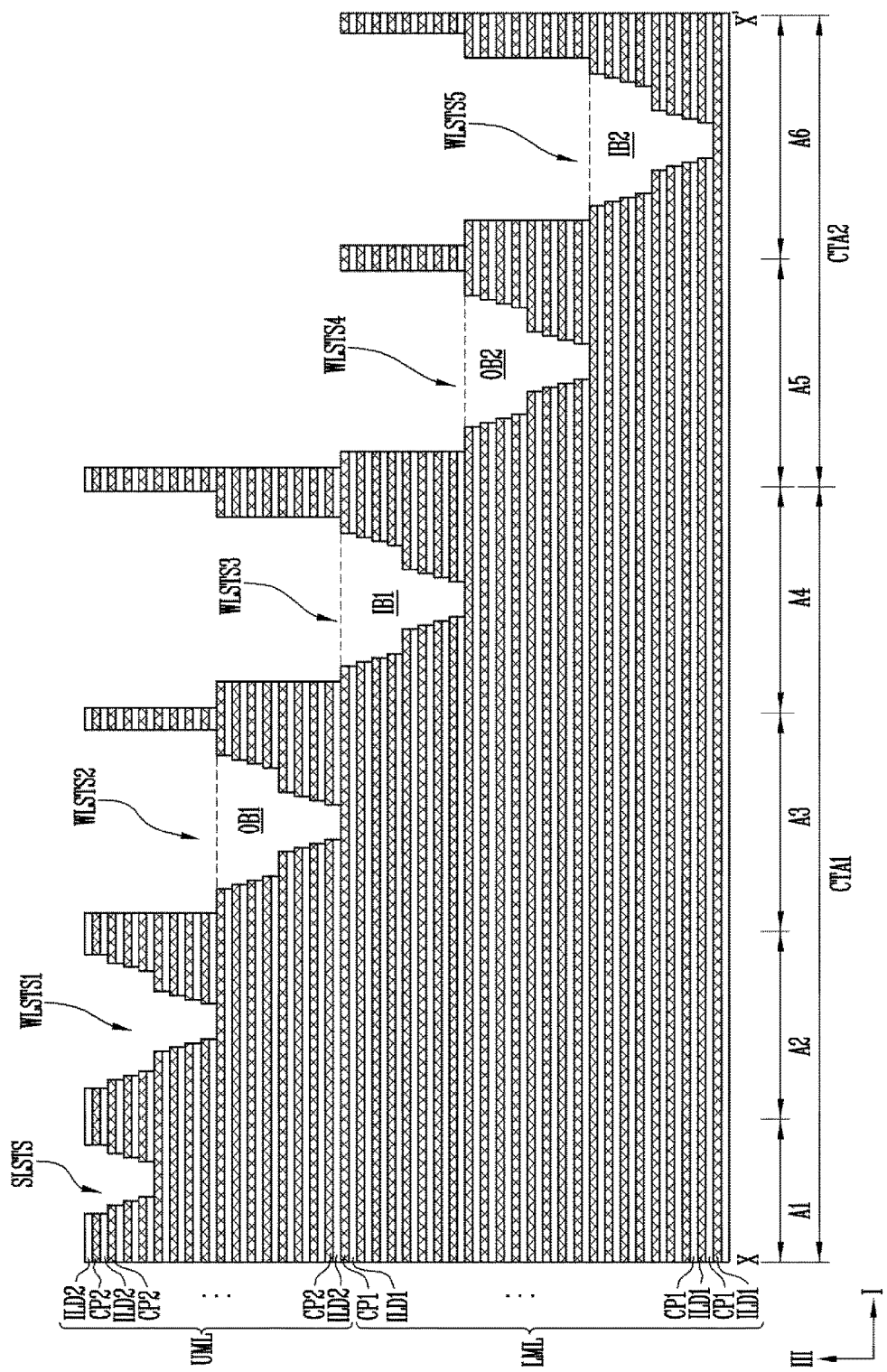

FIGS. 5A and 5B are plan and sectional views illustrating first and second stepped grooves according to an embodiment of the present disclosure.

Figure 6:
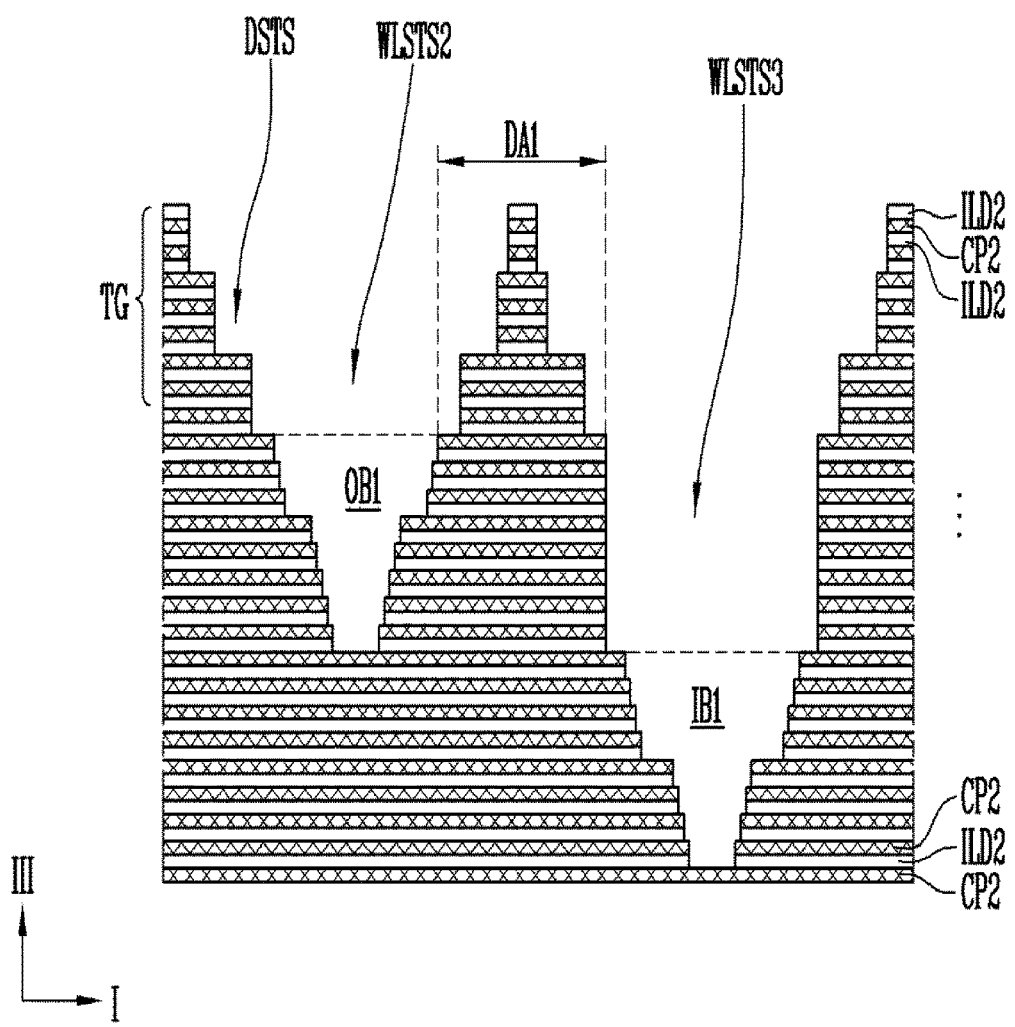

FIG. 6 is a sectional view illustrating structures of first group of stepped grooves according to an embodiment of the present disclosure.

Figure 7A:
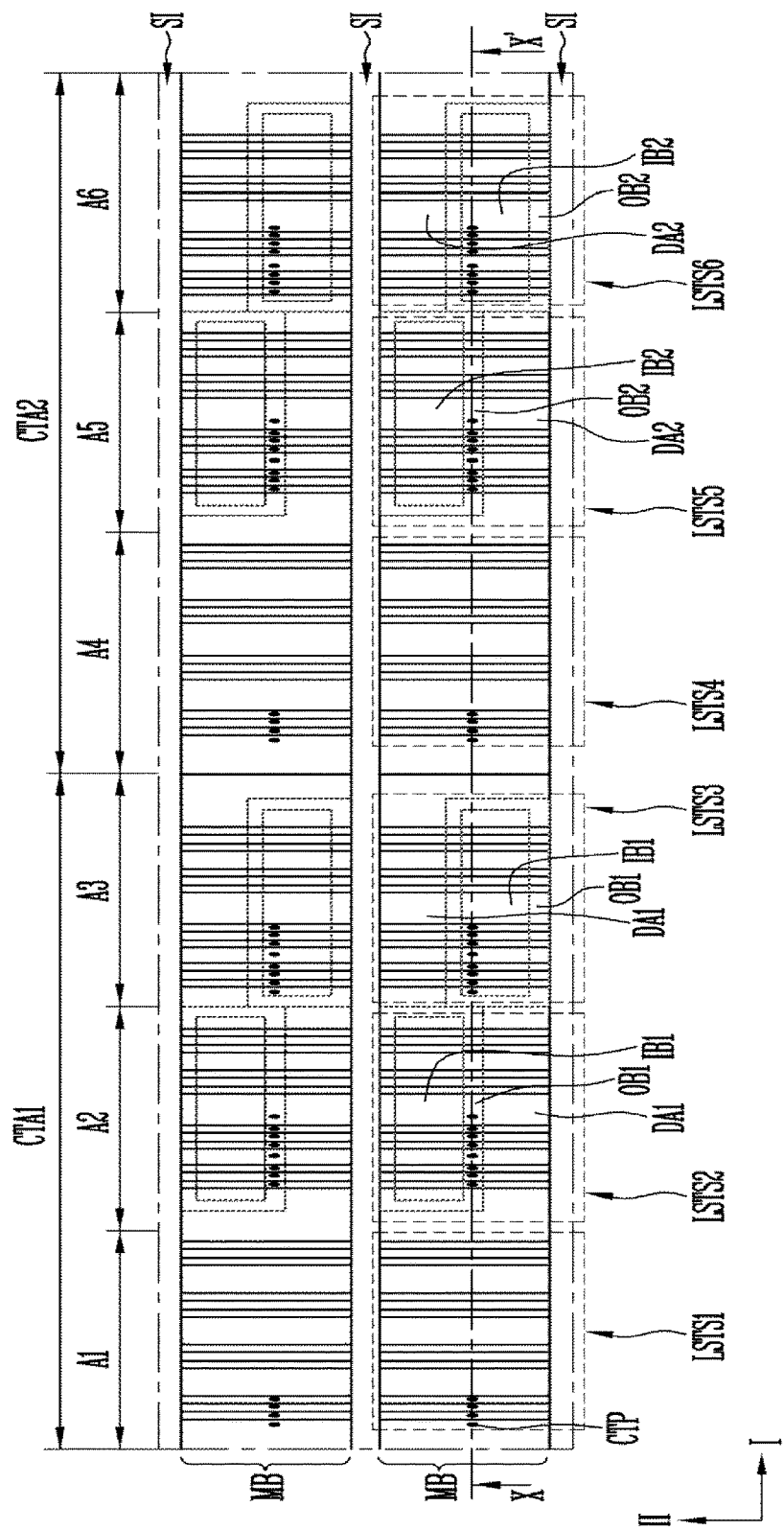
Figure 7B:
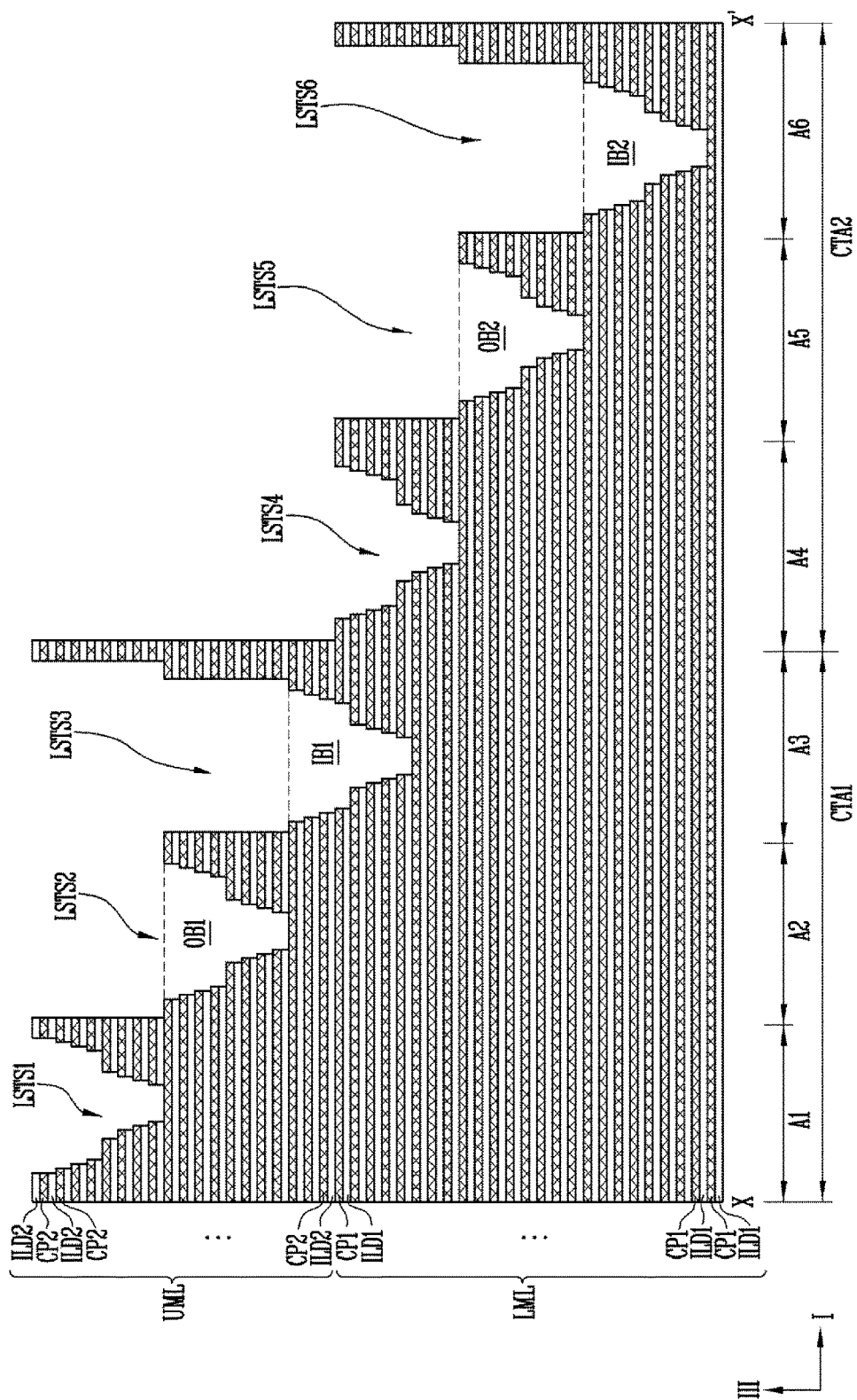

FIGS. 7A and 7B are plan and sectional views illustrating first and second group of stepped grooves according to an embodiment of the present disclosure.

Figure 8:
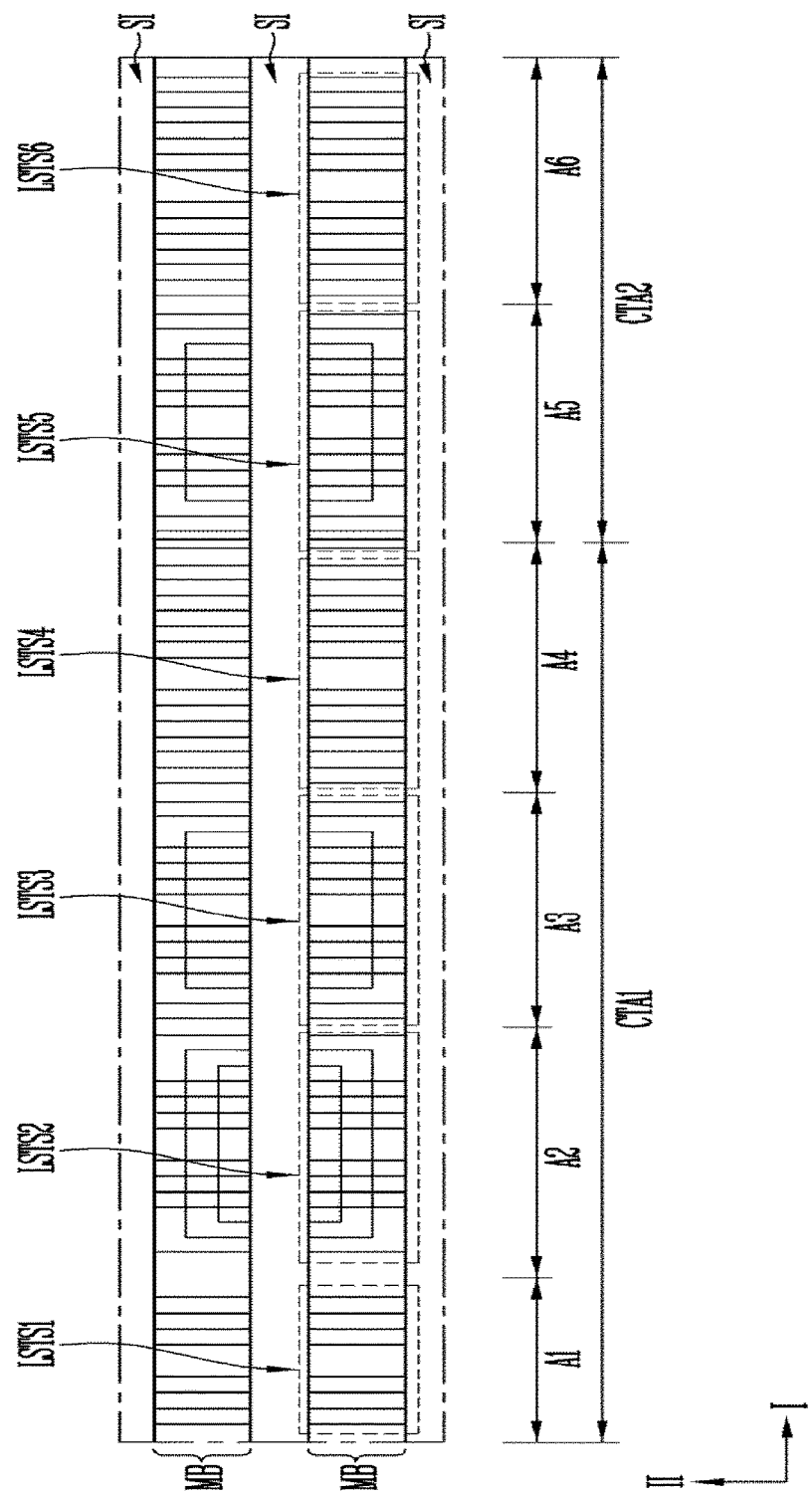

FIGS. 8 and 9 are plan views illustrating first and second stepped grooves according to various embodiments of the present disclosure.

FIGS. 10A to 15B are views illustrating a method of forming a memory block of a semiconductor device according to an embodiment of the present disclosure.

Figure 16:
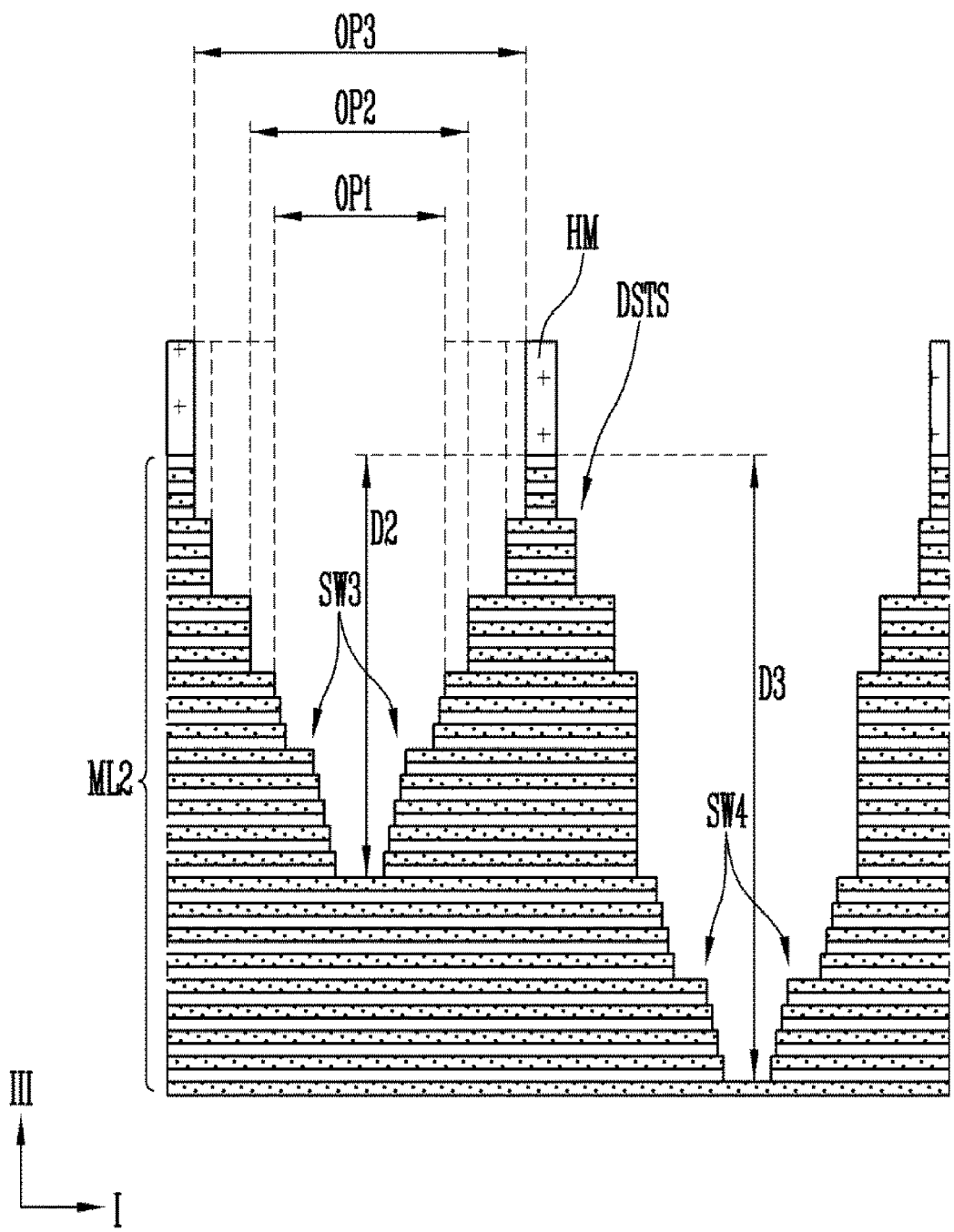

FIG. 16 is a sectional view illustrating a depressing process according to an embodiment of the present disclosure.

FIGS. 17A to 20B are views illustrating a method of forming a memory block of a semiconductor device according to an embodiment of the present disclosure.

Figure 21:
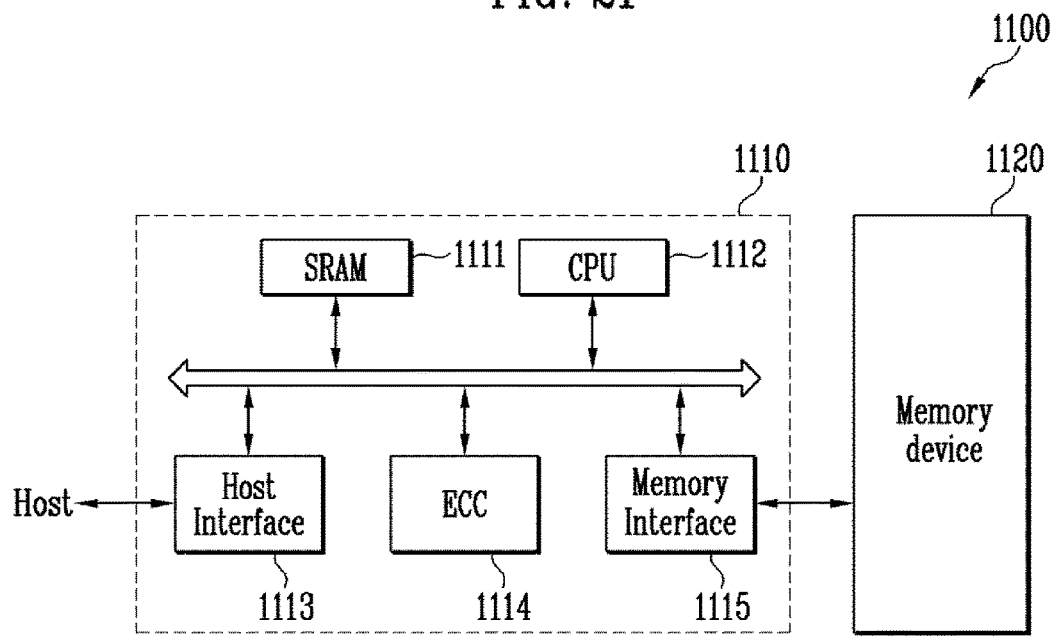

FIG. 21 is a configuration of a memory system illustrating an embodiment of the present disclosure.

Figure 22:
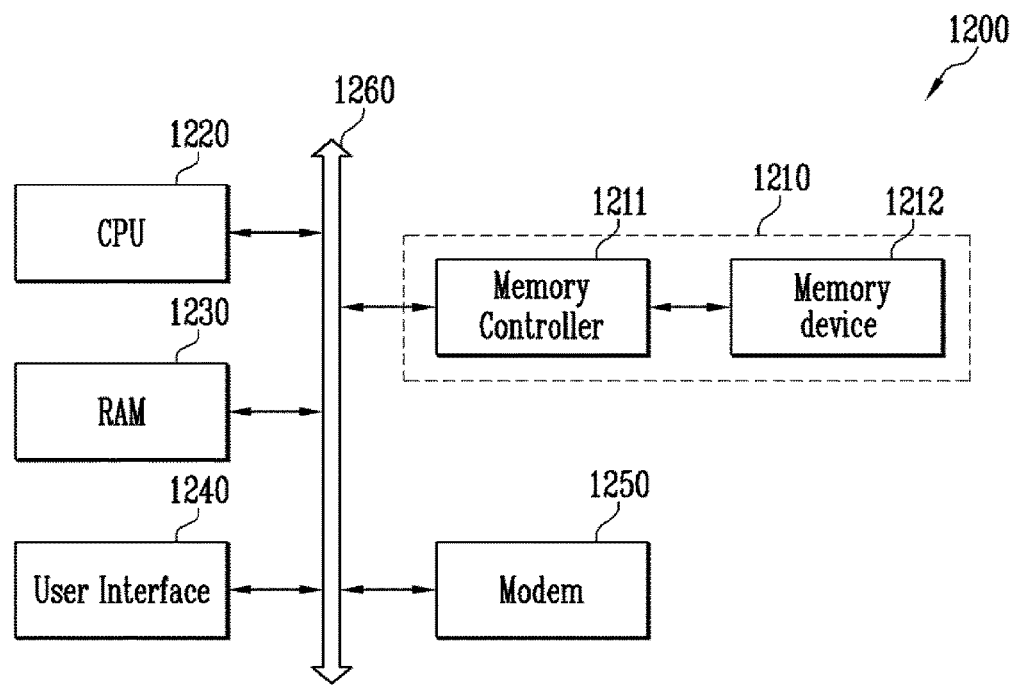

FIG. 22 is a configuration of a computing system illustrating an embodiment of the present disclosure.

DETAILED DESCRIPTION

Hereinafter, exemplary embodiments of the present disclosure will be described in detail with reference to the accompanying drawings. However, the present disclosure is not limited to the embodiments but may be implemented in different forms. The embodiments presented herein are provided only for illustrative purposes and for a full understanding of the scope of the present disclosure by those skilled in the art.

FIG. 1 is a view illustrating a cell area and a contact area of a semiconductor device according to an embodiment of the present disclosure.

Referring to FIG. 1, the semiconductor device according to an embodiment of the present disclosure includes memory blocks MB. Each of the memory blocks MB may include a cell area P1 and a contact area P2.

A plurality of memory strings are arranged in the cell area P1. Conductive patterns connected to the memory strings extend from the cell area P1 to the contact area P2 along or in a first direction I. Pass transistors may overlap the conductive patterns arranged in the contact area P2 under the conductive patterns.

The contact area P2 may be disposed at both sides of the cell area P1. The cell area P1 and the contact area P2 may be disposed in a line along the first direction I. The contact area P2 has a cell-side edge EG_C in contact with the cell area P1. In the following drawings, the cell-side edge EG_C is shown to represent a side surface of the contact area P2 in contact with the cell area P1, and a separate description of the cell-side edge EG_C will be omitted.

The memory blocks MB may be arranged in a second direction II vertically intersecting the first direction I while being spaced apart from each other.

FIGS. 2A and 2B are perspective views illustrating structures of memory strings of semiconductor devices according to embodiments of the present disclosure. For convenience of illustration, insulating layers are not shown in FIGS. 2A and 2B.

FIG. 2A illustrates a case where memory cells are arranged along U-shaped channel layers CH to constitute three-dimensional memory strings.

Referring to FIG. 2A, a memory string may include a U-shaped channel layer CH. The channel layer CH includes a pipe channel layer P_CH, a source-side channel layer S_CH, and a drain-side channel layer D_CH. The source-side channel layer S_CH and the drain-side channel layer D_CH extend from the pipe channel layer P_CH in a third direction III perpendicular to the first and second directions I and II. The channel layers CH may be arranged in a matrix form.

The pipe channel layer P_CH is surrounded by a pipe gate PG disposed over a substrate SUB.

The source-side channel layer S_CH is surrounded by source-side conductive patterns CP_S stacked along the third direction III. The source-side conductive patterns CP_S are spaced apart from each other. The top end of the source-side channel layer S_CH is connected to a common source line CSL. The source-side conductive patterns CP_S are disposed between the common source line CSL and the pipe gate PG. The source-side conductive patterns CP_S include source-side word lines WL_S and a source select line SSL. The source-side word lines WL_S are stacked along the third direction III while being spaced apart from each other. The source select line SSL is disposed between the source-side word lines WL_S and the common source line CSL. One, two, or more source select lines SSL may be stacked between the source-side word lines WL_S and the common source line CSL.

The drain-side channel layer D_CH is surrounded by drain-side conductive patterns CP_D stacked along the third direction III. The drain-side conductive patterns CP_D are spaced apart from each other. A top end of the drain-side channel layer D_CH is connected to a bit line BL. The drain-side conductive patterns CP_D are disposed between the bit line BL and the pipe gate PG. The drain-side conductive patterns CP_D include drain-side word lines WL_D and a drain select line DSL. The drain-side word lines WL_D are stacked along the third direction III and spaced apart from each other. The drain select line DSL is disposed between the drain-side word lines WL_D and the bit line BL. One, two, or more drain select lines DSL may be stacked between the drain-side word lines WL_D and the bit line BL.

The source-side conductive patterns CP_S and the drain-side conductive patterns CP_D may be separated by a slit SI disposed between the source-side channel layer S_CH and the drain-side channel layer D_CH. The source-side conductive patterns CP_S and the drain-side conductive patterns CP_D may be formed to have a same height. The source-side conductive patterns CP_S and the drain-side conductive patterns CP_D may extend along the first direction I.

The bit line BL and the common source line CSL may be disposed in different layers while being spaced apart from each other. For example, the bit line BL may be disposed upward from the common source line CSL, and the common source line CSL may be disposed between the bit line BL and the source-side conductive patterns CP_S.

Although not shown in FIG. 2A, an outer wall of the channel layer CH may be surrounded by a multi-layered memory layer including a tunnel insulating layer, a data storage layer, and a blocking insulating layer. Each of the source-side conductive patterns CP_S, the drain-side conductive patterns CP_D, and the pipe gate PG surrounds the channel layer CH with the multi-layered memory layer interposed therebetween.

According to the above-described structure, a pipe transistor is formed at an intersection portion of the pipe gate PG and the pipe channel layer P_CH. Drain-side memory cells are formed at intersection portions of the drain-side word lines WL_D and the drain-side channel layer D_CH, respectively. Source-side memory cells are formed at intersection portions of the source-side word lines WL_S and the source-side channel layer S_CH, respectively. A source select transistor is formed at an intersection portion of the source select line SSL and the source-side channel layer S_CH. A drain select transistor is formed at an intersection portion of the drain select line DSL and the drain-side channel layer D_CH. Accordingly, the drain select transistor, the drain-side memory cells, the pipe transistor, the source-side memory cells, and the source select transistor, which are connected in series along the channel layer CH, may constitute a U-shaped memory string. The U-shape memory string is connected between the bit line BL and the common source line CSL to constitute a three-dimensional memory device.

FIG. 2B illustrates a case where memory cells are arranged along straight-type channel layers CH to constitute three-dimensional memory strings.

Referring to FIG. 2B, a memory string may include a straight type channel layer CH. The channel layer CH is connected to a substrate SUB including a source area and that extends in the third direction III. The channel layer CH may be connected between the substrate SUB and a bit line BL. The channel layer CH may be connected to the source area of the substrate SUB. The channel layers CH may be arranged in a matrix form along the first and second directions I and II.

The channel layer CH is surrounded by conductive patterns CP stacked along the third direction III while being spaced apart from each other. The conductive patterns CP are disposed between the substrate SUB and the bit line BL. The conductive patterns CP may include a lower select line LSL, word lines WL stacked over the lower select line LSL, and an upper select line USL stacked over the word lines WL. The conductive patterns CP may be separated by a first slit SI1. The upper select line USL may be separated, by a second slit SI2, into units smaller than those of the word lines WL and the lower select line LSL. One, two, or more lower select lines LSL may be disposed between the word lines WL and the substrate SUB. One, two, or more upper select line USL may be disposed between the bit line BL and the word lines WL. The conductive patterns CP may extend in the first direction I.

Although not shown in FIG. 2B, the outer wall of the channel layer CH may be surrounded by a multi-layered memory layer including a tunnel insulating layer, a data storage layer, and a blocking insulating layer. Each of the conductive patterns CP surrounds the channel layer CH with the multi-layered memory layer interposed therebetween.

According to the above-described structure, a lower select transistor is formed at an intersection portion of the lower select line LSL and the channel layer CH. Memory cells are formed at intersection portions of the word lines WL and the channel layer CH, respectively. An upper select transistor is formed at an intersection portion of the upper select line USL and the channel layer CH. Accordingly, the lower select transistor, the memory cells, the upper select transistor, which are connected in series along the channel layer CH, may constitute a straight-type memory string. The memory string is connected between the bit line BL and a source line to a three-dimensional memory device.

The three-dimensional memory strings and channel layers CH, which are described in FIGS. 2A and 2B, may be arranged in a matrix form along the first and second directions I and II, and may be disposed in the cell area (P1 of FIG. 1) of the memory block (MB of FIG. 1).

FIG. 3 is a plan view illustrating a pass transistor according to an embodiment of the present disclosure. FIG. 3 illustrates a structure overlapping the contact area (P2 of FIG. 1) of the memory block (MB of FIG. 1) and under the memory block (MB of FIG. 1).

Referring to FIG. 3, pass transistors TR are arranged under the contact area (P2 of FIG. 1) of the memory block (MB of FIG. 1). The pass transistors TR are configured to transmit operation voltages to the conductive patterns (CP_S and CP_D of FIG. 2A or CP of FIG. 2B) in response to a block select signal. The pass transistors TR may be arranged in a line along the extending direction of a block select gate line 11G.

The block select gate line 11G may extend along the extending direction of the conductive patterns (CP_S and CP_D of FIG. 2A or CP of FIG. 2B), i.e., the first direction I. The block select gate line 11G is commonly connected to gates of the pass transistors TR arranged in a line along the first direction I. The block select gate line 11G is formed on the substrate (SUB of FIG. 2A or FIG. 2B) with a gate insulating layer (not show) interposed therebetween. Two or more block select gate lines 11G may be arranged in parallel along the second direction II while being spaced apart from each other. The substrate is exposed at both sides of the block select gate line 11G.

The substrate overlapping the contact area (P2 of FIG. 1) of the memory block (MB of FIG. 1) may include active areas A and isolation areas B. The active areas A and the isolation areas B may be alternately arranged along the first direction I. The active areas A and the isolation areas B extend along the second direction II. The isolation areas B are filled with an isolation insulating layer penetrating a portion of the substrate. The active areas A are isolated by the isolation areas B. The active areas A may include first and second junction areas J1 and J2 doped with impurities. The first and second junction areas J1 and J2 are formed within active areas A exposed on both sides of the block select gate line 11G. The second junction areas J2 may be disposed between two block select gate lines 11G and may be adjacent to each other in the second direction II. The first junction areas J1 may be disposed in two lines with the two block select gate lines 11G interposed therebetween.

The first and second junction areas J1 and J2 may respectively be used as source and drain areas of each of the pass transistors TR. The pass transistors TR configured with the block select gate line 11G and the first and second junction areas J1 and J2 may be connected to routing lines disposed over the pass transistors TR.

A memory block may overlap the block select gate line 11G over the block select gate line 11G. The memory block may include a plurality of memory strings. The memory strings may be formed into the structure described in FIG. 2A or 2B. Conductive patterns of the memory block, connected to the memory strings, may be connected to the pass transistors TR via the routing lines. In embodiments of the present disclosure, stepped grooves are formed in the conductive patterns so as to connect the conductive patterns and the pass transistors TR to each other. Stepped grooves according to embodiments of the present disclosure will be described in detail with reference to the accompanying drawings.

FIGS. 4A and 4B are plan and sectional views respectively schematically illustrating a contact area in a semiconductor device according to an embodiment of the present disclosure.

Referring to FIGS. 4A and 4B, the semiconductor device according to an embodiment of the present disclosure includes a memory block MB. The memory block MB is disposed over a substrate including a cell area P1 and a contact area P2, where the contact area P2 extends along the first direction I from the cell area P1. The contact area P2 may include a first contact area CTA1 and a second contact area CTA2. The first contact area CTA1 may extend toward the second contact area CTA2 along the first direction I from the cell area P1. The second contact area CTA2 may extend along the first direction I from the first contact area CTA1. The first and second contact areas CTA1 and CTA2 may be arranged in a line along the first direction I at one side of the cell area P1. The first contact area CTA1 is disposed between the cell area P1 and the second contact area CTA2.

The memory block MB may include a lower stacked structure LML and an upper stacked structure UML disposed on the lower stacked structure LML. Although not specifically shown in FIG. 4B, the lower stacked structure LML includes first interlayer insulating layers and first conductive patterns, which are alternately stacked over the substrate. The upper stacked structure UML includes second interlayer insulating layers and second conductive patterns, which are also alternately stacked over the lower stacked structure LML. The lower stacked structure LML extends in the first direction I toward or over the second contact area CTA2 from the cell area P1, and the upper stacked structure UML extends in the first direction I toward the second contact area CTA2 and over the first contact area CTA1 from the cell area P1. The upper stacked structure UML does not overlap the second contact area CTA2 which leaves the second contact area CTA2 open from coverage by the upper stacked structure UML.

The upper stacked structure UML and the lower stacked structure LML may be penetrated by a channel layer CH disposed in the cell area P1. The first conductive patterns of the lower stacked structure LML and the second conductive patterns of the upper stacked structure UML may be the conductive patterns described in FIGS. 2A and 2B.

At least one portion of the upper stacked structure UML may be penetrated by N (N is a natural number of 2 or more) first group of stepped grooves. At least one portion of the lower stacked structure LML may be penetrated by M (M is a natural number equal to or smaller than N) second group of stepped grooves. The first group of stepped grooves and the second group of stepped grooves may be formed to provide areas in which contact plugs are to be connected to the conductive patterns. The first group of stepped grooves and the second group of stepped grooves may be formed in various shapes. Hereinafter, the first group of stepped grooves and the second group of stepped grooves according to embodiments of the present disclosure will be described in detail with reference to FIGS. 5A to 9.

FIGS. 5A and 5B are plan and sectional views illustrating the first and second group of stepped grooves according to an embodiment of the present disclosure. FIG. 5B is a sectional view taken along line X-X' shown in FIG. 5A. For convenience of illustration, sections of contact plugs are not shown in FIG. 5B.

Referring to FIGS. 5A and 5B, a first group of stepped grooves SLSTS and WLSTS1 to WLSTS3 may be formed by penetrating a memory block MB in a first contact area CTA1, and a second group of stepped grooves WLSTS4 and WLSTS5 may be formed by penetrating the memory block MB in a second contact area CTA2. Each of the first group of stepped grooves SLSTS and WLSTS1 to WLSTS3 and the second group of stepped grooves WLSTS4 and WLSTS5 has stepped sidewalls symmetrically opposite to each other in the first direction I.

The memory block MB is formed into a stacked structure of a lower stacked structure LML and an upper stacked structure UML. The memory block MB may be isolated by slits SI disposed opposite to each other in the second direction II intersecting the first direction I. The lower stacked structure LML and the upper stacked structure UML may be disposed between adjacent slits SI. The upper stacked structure UML may possibly not overlap the second contact area CTA2, leaving the lower stacked structure LML exposed in the second contact area CTA2.

The lower stacked structure LML includes first interlayer insulating layers ILD1 and first conductive patterns CP1, which extend from the first contact area CTA1 toward and over the second contact area CTA2 from a cell area and are alternately stacked over a substrate (not shown). The upper stacked structure UML includes second interlayer insulating layers ILD2 and second conductive patterns CP2, which extend over the first contact area CTA1 from the cell area and do not extend over the second contact area CTA2 to leave the second contact area CTA2 open. The second interlayer insulating layers ILD2 and second conductive patterns CP2 which comprise the upper stacked structure UML may be alternately stacked on the lower stacked structure LML.

The first contact area CTA1 may include N areas (e.g., A1 to A4) arranged in a line along the first direction I, and the second contact area CTA2 may include M areas (e.g., A5 and A6) arranged in a line along the first direction I. Hereinafter, for convenience of illustration, a case where the first contact area CTA1 includes first to fourth areas A1 to A4 and the second contact area CTA2 includes fifth and sixth areas A5 and A6 is described as an example, but embodiments of the present disclosure are not limited thereto.

The first group of stepped grooves SLSTS and WLSTS1 to WLSTS3 are disposed in the first to fourth areas A1 to A4, respectively. Bottom surfaces of first group of stepped grooves SLSTS and WLSTS1 to WLSTS3 may be disposed at different depths. A portion (e.g., WLSTS3) of the first group of stepped grooves SLSTS and WLSTS1 to WLSTS3 may extend down to inside the lower stacked structure LML. The first group of stepped grooves SLSTS and WLSTS1 to WLSTS3 may include first-type of stepped grooves SLSTS and WLSTS1 and second-type of stepped grooves WLSTS2 and WLSTS3.

The first-type of stepped grooves SLSTS and WLSTS1 may include stepped sidewalls extending flat along the second direction II, the stepped sidewalls and first type of stepped grooves SLSTS and WLSTS1 being isolated by the slits SI. The first-type of stepped grooves SLSTS and WLSTS1 may include a select step structure SLSTS and a first word line step structure WLSTS1. The select step structure SLSTS may be disposed in the first area A1 of the first contact area CTA1 adjacent to the cell area, and the first word line step structure WLSTS1 may be disposed between the second-type of stepped grooves WLSTS2 and WLSTS3 and the select step structure SLSTS. The first word line step structure WLSTS1 may be disposed in the second area A2 of the first contact area CTA1. The first word line step structure WLSTS1 may include a larger number of steps than the select step structure SLSTS, so that the first word line step structure WLSTS1 may be formed deeper than the select step structure SLSTS.

The second-type of stepped grooves WLSTS2 and WLSTS3 may be spaced apart from each other disposed in the first direction I. The second-type of stepped grooves WLSTS2 and WLSTS3 may be disposed in the third and fourth areas A3 and A4 of the first contact area CTA1, respectively. The second-type of stepped grooves WLSTS2 and WLSTS3 may include a second word line step structure WLSTS2 and a third word line step structure WLSTS3. Each of the second-type of stepped grooves WLSTS2 and WLSTS3 may include a first outbox area OB1, a first inbox area IB1 surrounded by the first outbox area OB1, and a first dummy area DA1 surrounding the first outbox area OB1. The first outbox area OB1 of each of the second-type of stepped grooves WLSTS2 and WLSTS3 is formed deeper than the first-type of stepped grooves SLSTS and WLSTS1 and the first dummy area DA1, and the first inbox area IB1 is formed deeper than the first outbox area OB1. The first dummy area DA1 may include a sidewall formed into a first step structure. The first step structure may be formed at the same depth as the first word line step structure WLSTS1. The first step structure may be depressed inside the first outbox area OB1 to form a second step structure. The second step structure may be depressed inside the first inbox area IB1 to form a third step structure.

The first step structure may be seen through a section of the first dummy area DA1, taken along the first direction I. Since the section of the first dummy area DA1, taken along the first direction I, is the same as that of the first word line step structure WLSTS1, the section of the first dummy area DA1 is not illustrated. The shape of the first step structure refers to that of the first word line step structure WLSTS1. Referring to the shape of the first word line step structure WLSTS1, it may be seen that each of the steps constituting the first step structure includes a pair of the second interlayer insulating layer ILD2 and the second conductive pattern CP2. When the first step structure includes x (x is a natural number of 2 or more) steps, a step difference between the first dummy area DA1 and the first outbox area OB1 and a step difference between the first outbox area OB1 and the first inbox area IB1 may be formed by a height of one to (x+1) pairs of second interlayer insulating layers ILD2 and second conductive patterns CP2. Accordingly, the second conductive patterns CP2 disposed in different layers may be exposed through the second and third step structures in the first outbox area OB1 and the first inbox area IB1. The first inbox area IB1 may be disposed in an upper inside of the lower stacked structure LML according to an etching depth. Accordingly, some of the first conductive patterns CP1 of the lower stacked structure LML may be exposed in the first inbox area IB1.

The first outbox areas OB1 may be arranged in a zigzag pattern in the first direction I. The first inbox areas IB1 may be arranged in a zigzag pattern along the first direction I. Although not shown in these figures, the first outbox areas OB1, adjacent to each other along the first direction I, may be connected to each other. A structure in which the first outbox areas OB1 are connected to each other will be described later with reference to FIGS. 7A and 7B. The first outbox area OB1 and the first inbox area IB1, which are disposed in different areas, may include ends disposed in a straight line along the first direction I. More specifically, an end of the first outbox area OB1 disposed in the third area A3 and an end of the first inbox area IB1 disposed in the fourth area A4 may be disposed in a straight line along the first direction I. In this case, a plurality of contact plugs CTP may be disposed in the first outbox area OB1 and the first inbox area IB1, which have different depths in a straight light along the first direction I.

The second group of stepped grooves WLSTS4 and WLSTS5 are disposed in the fifth and sixth areas A5 and A6, respectively. Bottom surfaces of the second group of stepped grooves WLSTS4 and WLSTS5 are disposed at positions deeper than the bottom surfaces of the first group of stepped grooves SLSTS and WLSTS1 to WLSTS3 within the memory block MB. The second group of stepped grooves WLSTS4 and WLSTS5 may be formed in a same layout as the second-type of stepped grooves WLSTS2 and WLSTS3. There may be two or more second-types of stepped grooves WLSTS2 and WLSTS3 which may be formed to have the same number as the second group of stepped grooves WLSTS4 and WLSTS5.

The second group of stepped grooves WLSTS4 and WLSTS5 may be disposed along the first direction I while being space apart from each other. The second group of stepped grooves WLSTS4 and WLSTS5 may be disposed in the fifth and sixth areas A5 and A6 of the second contact area CTA2, respectively. The second group of stepped grooves WLSTS4 and WLSTS5 may include a fourth word line step structure WLSTS4 and a fifth word line step structure WLSTS5. Each of the second group of stepped grooves WLSTS4 and WLSTS5 may include a second outbox area OB2, a second inbox area IB2 surrounded by the second outbox area OB2, and a second dummy area DA2 surrounding the second outbox area OB2. The second outbox area OB2 of each of the second group of stepped grooves WLSTS4 and WLSTS5 is formed deeper than the first outbox area OB1, and the second inbox area IB2 is formed deeper than the second outbox area OB2. The second dummy area DA2 may include a sidewall formed into a fourth step structure. The fourth step structure may be formed deeper than the first outbox area OB1. The fourth step structure may be depressed inside the second outbox area OB2 to form a fifth step structure. The fifth step structure may be depressed inside the second inbox area IB2 to form a sixth step structure.

Although not shown in these figures, a section of the fourth step structure, in the first direction I, has only a different depth from the that of the first outbox area OB1, in the first direction I, and the shape and number of steps of the fourth step structure are the same as the first outbox area OB1. Each of the steps constituting the fourth step structure may include a pair of the first interlayer insulating layer ILD1 and the first conductive pattern CP1. When the fourth step structure includes x (x is a natural number of 2 or more) steps, a step difference between the second dummy area DA2 and the second outbox area OB2 and a step difference between the second outbox area OB2 and the second inbox area IB2 may be formed by a height of one to (x+1) pairs of first interlayer insulating layers ILD1 and first conducive patterns CP1. Accordingly, the first conductive patterns CP1 disposed in different layers may be exposed in the fifth and sixth step structures in the second outbox area OB2 and the second inbox area IB2.

The second outbox areas OB2 may be arranged in a zigzag pattern along the first direction I. The second inbox areas IB2 may be arranged in a zigzag pattern along the first direction I. Although not shown in these figures, the second outbox areas OB2, adjacent to each other in the first direction I, may be connected to each other. A structure in which the second outbox areas OB2 are connected to each other will be described later with reference to FIGS. 7A and 7B. The second outbox area OB2 and the second inbox area IB2, which are disposed in different areas, may include ends disposed in a straight line along the first direction I. More specifically, an end of the second outbox area OB2 disposed in the fifth area A5 and an end of the second inbox area IB2 disposed in the sixth area A6 may be disposed in a straight line along the first direction I. In this case, a plurality of contact plugs CTP may be disposed in the second outbox area OB2 and the second inbox area IB2, which have different depths in a straight light along the first direction I.

The first conductive patterns CP1 and the second conductive patterns CP2, which are disposed in different layers, may be exposed through the first group of stepped grooves SLSTS and WLSTS1 to WLSTS3 and the second group of stepped grooves WLSTS4 and WLSTS5, which have the above-described structures, to be respectively connected to the contact plugs CTP. Some of the contact plugs CTP may be disposed in any one of the first inbox area IB1, the first outbox area OB1, the second inbox area IB2, and the second outbox area OB2 to be connected to any one of the first conductive pattern CP1 or the second conductive patterns CP2. The contact plugs CTP disposed in the first group of stepped grooves SLSTS and WLSTS1 to WLSTS3 and the second group of stepped grooves WLSTS4 and WLSTS5 may be disposed at a cell-area-side stepped sidewall of each of the first group of stepped grooves SLSTS and WLSTS1 to WLSTS3 and the second group of stepped grooves WLSTS4 and WLSTS5 to be connected to the cell area.

FIG. 6 is a sectional view illustrating structures of first group of stepped grooves according to an embodiment of the present disclosure. For convenience of illustration, contact plugs are not illustrated in FIG. 6, and only a portion of an upper stacked structure is illustrated in FIG. 6.

Referring to FIG. 6, first group of stepped grooves (e.g., WLSTS2 and WLSTS3), as described in FIGS. 5A and 5B, may penetrate second interlayer insulating layers ILD2 and second conductive patterns CP2. The first group of stepped grooves WLSTS2 and WLSTS3 may include a first inbox area IB1, a first outbox area OB1, and a first dummy area DA1. The first inbox area IB1 and the first outbox area OB1 may be formed into the same structure as described in FIGS. 5A and 5B.

Some of the second interlayer insulating layers ILD2 and the second conductive patterns CP2, which define a sidewall of the first dummy area DA1 and constitute an upper end of an upper stacked structure, are defined as an upper group TG. The upper group of the second interlayer insulating layers ILD2 and the second conductive patterns CP2 may form a dummy step structure DSTS between the first group of stepped grooves (e.g., WLSTS2 and WLSTS3) adjacent to each other. The dummy step structure DSTS may be formed through a process of widening the width of an upper end of each of the first group of stepped grooves (e.g., WLSTS2 and WLSTS3). Accordingly, an aspect ratio of each of the first group of stepped grooves (e.g., WLSTS2 and WLSTS3) may be advantageously reduced through the dummy step structure DSTS in a manufacturing process of a semiconductor device.

FIGS. 7A and 7B are plan and sectional views illustrating first and second group of stepped grooves according to an embodiment of the present disclosure. FIG. 7B is a sectional view taken along line X-X' shown in FIG. 7A. For convenience of illustration, sections of contact plugs are not illustrated in FIG. 7B.

Referring to FIGS. 7A and 7B, a first group of stepped grooves LSTS1 to LSTS3 may be formed by penetrating a memory block MB in a first contact area CTA1, and second group of stepped grooves LSTS4 to LSTS6 may be formed by penetrating the memory block MB on a second contact area CTA2. Each of the first group of stepped grooves LSTS1 to LSTS3 and the second group of stepped grooves LSTS4 to LSTS6 has stepped sidewalls symmetrically opposite to each other in the first direction I.

The memory block MB may be formed into the same structure as described in FIGS. 5A and 5B. Briefly, the memory block MB is formed into a stacked structure of a lower stacked structure LML and an upper stacked structure UML. The memory block MB may be isolated by slits SI. The lower stacked structure LML includes first interlayer insulating layers ILD1 and first conductive patterns CP1, which are alternately stacked over a substrate (not shown). The upper stacked structure UML includes second interlayer insulating layers ILD2 and second conductive patterns CP2, which are alternately stacked on the lower stacked structure LML.

The first contact area CTA1 may include N areas (e.g., A1 to A3) arranged in a line along the first direction I, and the second contact area CTA2 may include M areas (e.g., A4 to A6) arranged in a line along the first direction I. Hereinafter, for convenience of illustration, a case where the first contact area CTA1 includes first to third areas A1 to A3 and the second contact area CTA2 includes fourth to sixth areas A4 to A6 is described as an example, but the embodiment of the present disclosure is not limited thereto.

The first group of stepped grooves LSTS1 to LSTS3 may be disposed in the first to third areas A1 to A3, respectively. Bottom surfaces of the first stepped grooves LSTS1 to LSTS3 may be disposed at different depths. A portion (e.g., LSTS3) of the first stepped grooves LSTS1 to LSTS3 may extend down inside the lower stacked structure LML. The first stepped grooves LSTS1 to LSTS3 may include a first-type of stepped groove LSTS1 and second-type of stepped grooves LSTS2 and LSTS3.

The first-type of stepped grooves LSTS1 may include stepped sidewalls extending flat along the second direction II, the stepped sidewalls being isolated by the slits SI. An upper portion of the first-type of stepped grooves LSTS1 may be used as a contact area of select lines, and a lower portion of the first-type of stepped grooves LSTS1 may be used as a contact area of word lines.

The second-type of stepped grooves LSTS2 and LSTS3 may be disposed along the first direction I while being spaced apart from each other. The second-type of stepped grooves LSTS2 and LSTS3 may be disposed in the second and third areas A2 and A3 of the first contact area CTA1, respectively. The second-type of stepped grooves LSTS2 and LSTS3 may be used as contact areas of word lines. Each of the second-type of stepped grooves LSTS2 and LSTS3, as described in FIGS. 5A and 5B, may include a first outbox area OB1, a first inbox area surrounded by the first outbox area OB1, and a first dummy area DA1 surrounding the first outbox area OB1.

The first outbox areas OB1, adjacent to each other in the first direction I, may be formed into structures connected to each other or spaced apart from each other. A case where the first outbox areas OB1, adjacent to each other in the first direction I, is illustrated in FIGS. 7A and 7B. In this case, the second interlayer insulating layers ILD2 and the second conductive patterns CP2 may be stacked with a height lower than the height of the upper stacked structure UML in an area in which the first outbox areas OB1 are connected to each other. That is, the upper stacked structure UML may include a depression portion formed in an area in which the first outbox areas OB1 are connected to each other. Accordingly, an aspect ratio of each of the second-type of stepped grooves LSTS2 and LSTS3 may be advantageously reduced in a manufacturing process of a semiconductor device.

The second group of stepped grooves LSTS4 to LSTS6 is disposed on the fourth to sixth areas A4 to A6, respectively. Bottom surfaces of the second group of stepped grooves LSTS4 to LSTS6 may be disposed at different depths. The bottom surfaces of the second group of stepped grooves LSTS4 to LSTS6 are disposed at positions deeper than the bottom surfaces of the first group of stepped grooves LSTS1 to LSTS3. The second group of stepped grooves LSTS4 to LSTS6 may include a third-type of stepped grooves LSTS4 formed in a same layout as the first-type of stepped grooves LSTS1 and fourth-type of stepped grooves LSTS5 and LSTS6 formed in the same layout as the second-type of stepped grooves LSTS2 and LSTS3.

The third-type of stepped grooves LSTS4 may be disposed between the second-type of stepped grooves LSTS2 and LSTS3 and the fourth-type of stepped grooves LSTS5 and LSTS6. The third-type of stepped grooves LSTS4 may be disposed in the fourth area A4 of the second contact area CTA2. The third-type of stepped groove LSTS4 may include stepped sidewalls extending flat along the second direction II, the stepped sidewalls being isolated by the slits SI. The third-type of stepped groove LSTS4 may be used as a contact area of word lines.

The fourth-type of stepped grooves LSTS5 and LSTS6 may be disposed along the first direction I while being spaced apart from each other. The fourth-type of stepped grooves LSTS5 and LSTS6 may be disposed in the fifth and sixth areas A5 and A6 of the second contact area CTA2. The fourth-type of stepped grooves LSTS5 and LSTS6 may be used as contact areas of word lines. Like the second group of stepped grooves described in FIGS. 5A and 5B, each of the fourth-type of stepped grooves LSTS5 and LSTS6 may include a second outbox area OB2, a second inbox area IB2 surrounded by the second outbox area OB2, and a second dummy area DA2 surrounding the second outbox area OB2.

The second outbox areas OB2, adjacent to each other in the first direction I, may be formed into structures connected to each other or spaced apart from each other. A case where the second outbox areas OB2 are adjacent to each other in the first direction I and connected to each other is illustrated in FIGS. 7A and 7B. In this case, the first interlayer insulating layers ILD1 and the first conductive patterns CP1 may be stacked with a height lower than the height of the lower stacked structure LML in an area in which the second outbox areas OB2 are connected to each other. That is, the lower stacked structure LML may include a depression portion formed in an area in which the second outbox areas OB2 are connected to each other. Accordingly, an aspect ratio of each of the fourth-type of stepped grooves LSTS5 and LSTS6 may be advantageously reduced in the manufacturing process of the semiconductor device.

The first conductive patterns CP1 and the second conductive patterns CP2, which are disposed in different layers, may be exposed through the first group of stepped grooves LSTS1 to LSTS3 and the second group of stepped grooves LSTS4 to LSTS6, which have the above-described structures, to be respectively connected to contact plugs CTP. Some of the contact plugs CTP may be disposed in any one of the first inbox area IB1, the first outbox area OB1, the second inbox area IB2, and the second outbox area OB2 to be connected to any one of the first conductive pattern CP1 or the second conductive patterns CP2. The contact plugs CTP disposed in the first group of stepped grooves LSTS1 to LSTS3 and the second group of stepped grooves LSTS4 to LSTS6 may be disposed at a cell-area-side stepped sidewall of each of the first group of stepped grooves LSTS1 to LSTS3 and the second group of stepped grooves LSTS4 to LSTS6 to be connected to a cell area.

FIG. 8 is a plan view illustrating first and second stepped grooves according to an embodiment of the present disclosure. FIG. 8 is a view illustrating one of various layouts of the first and second stepped grooves, and therefore, its sectional view will be omitted.

Referring to FIG. 8, a first group of stepped grooves LSTS1 to LSTS4 and a second group of stepped grooves LSTS5 and LSTS6 may be formed inside a memory block MB isolated by slits SI, and the second group of stepped grooves LSTS5 and LSTS6 may be formed in a same layout as some (e.g., LSTS3 and LSTS4) of the first group of stepped grooves LSTS1 to LSTS4.

The first group of stepped grooves LSTS1 to LSTS4 may be formed at different depths. The second group of stepped grooves LSTS5 and LSTS6 may be formed deeper than the first group of stepped grooves LSTS1 to LSTS4. The first group of stepped grooves LSTS1 to LSTS4 may be disposed on first to fourth areas A1 to A4 of a first contact area CTA1, respectively. The second group of stepped grooves LSTS6 and LSTS5 may be disposed on fifth and sixth areas A5 and A6 of a second contact area CTA2, respectively.

The first group of stepped grooves LSTS1 to LSTS4 may extend flat toward the slit SI or may form step structures along the first and second directions I and II.

The second group of stepped grooves LSTS5 and LSTS6 may extend flat toward the slit SI or may form step structures along the first and second directions I and II.

FIG. 9 is a plan view illustrating first and second stepped grooves according to an embodiment of the present disclosure. FIG. 9 is a view illustrating one of various layouts of the first and second stepped grooves, and therefore, its sectional view will be omitted.

Referring to FIG. 9, a first group of stepped grooves LSTS1 to LSTS4 and a second group of stepped groove LSTS5 may be formed inside a memory block MB isolated by slits SI, and the second group of stepped groove LSTS5 may be formed in the same layout as a portion (e.g., LSTS4) of the first group of stepped grooves LSTS1 to LSTS4.

The first group of stepped grooves LSTS1 to LSTS4 may be formed at different depths, and the second group of stepped groove LSTS5 may be formed deeper than the first group of stepped grooves LSTS1 to LSTS4. The first group of stepped grooves LSTS1 to LSTS4 may be disposed on first to fourth areas A1 to A4 of a first contact area CTA1, respectively.

The second group of stepped groove LSTS5 may be disposed on a fifth area A5 of a second contact area CTA2.

As shown in FIGS. 8 and 9, one or more of a second group of stepped grooves disposed in the second contact area CTA2 may be formed in the same layout as the first group of stepped grooves disposed in the first contact area CTA1. The number of a second group of stepped grooves formed in the same layout as the first group of stepped grooves may be variously changed depending on a number of stacked interlayer insulating layers and conductive patterns, which constitute the memory block MB.

Manufacturing methods of semiconductor devices according to embodiments of the present disclosure will be described with reference to the accompanying drawings. Each of the following drawings illustrates a structure formed over a substrate including the pass transistors described in FIG. 3.

FIGS. 10A to 15B are views illustrating a method of forming a memory block of a semiconductor device according to an embodiment of the present disclosure. FIGS. 10B, 11B, 12B, 13B, 14B, and 15B are sectional views taken along lines "X-X'" shown in FIGS. 10A, 11A, 12A, 13A, 14A, and 15A, respectively.

Figure 10A:
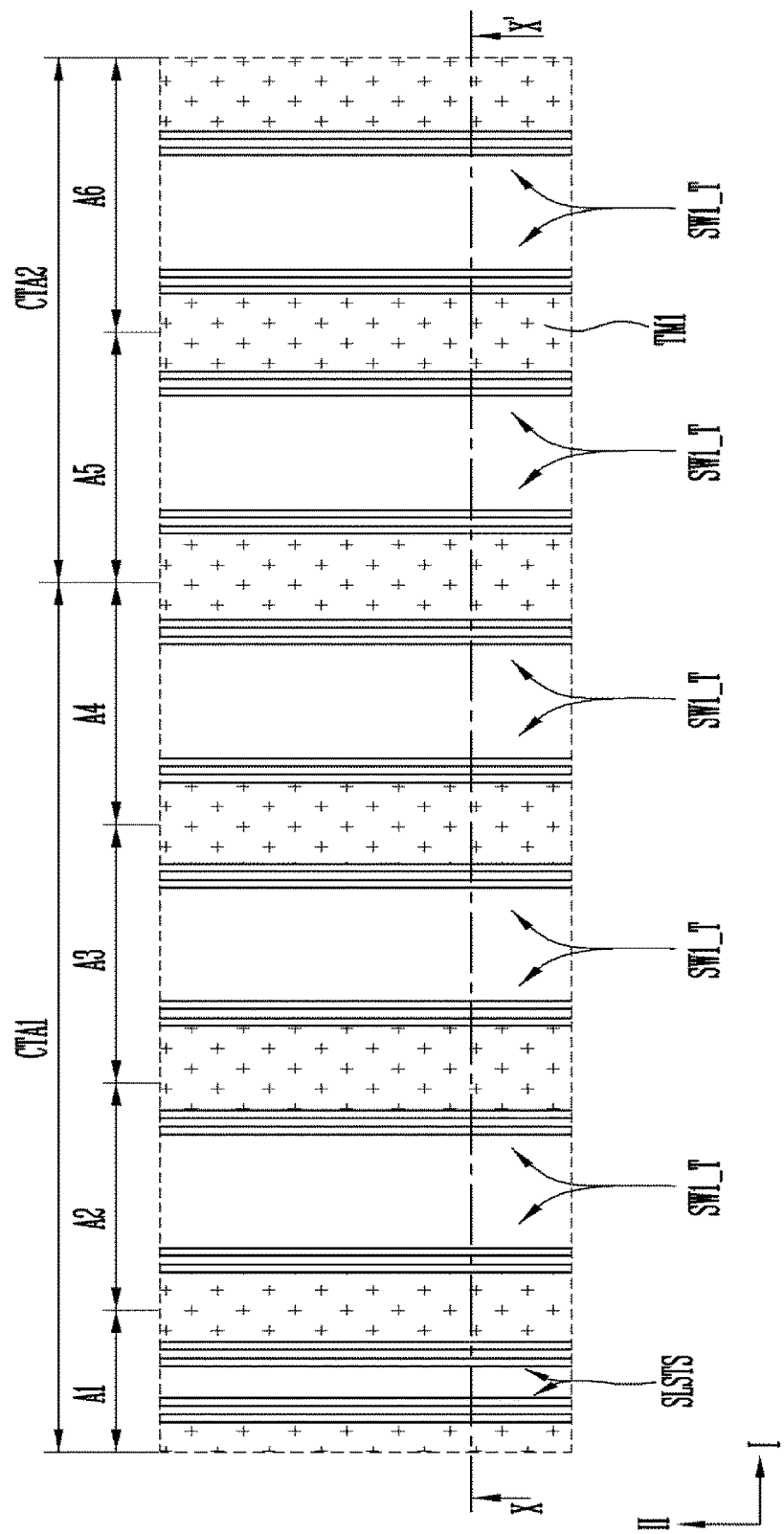

FIGS. 10A and 10B are plan and sectional views illustrating a process of forming an upper step structure of a stepped trench.

Referring to FIGS. 10A and 10B, first material layers 131 and second material layers 133 are alternately stacked over a substrate including a first contact area CTA1 extending along the first direction I from a cell area (see FIG. 1 or FIG. 4) and a second contact area CTA2 extending along the first direction I from the first contact area CTA1.

The first contact area CTA1 may be divided into N areas arranged in a line along the first direction I from the cell area. The second contact area CTA2 may be divided into M areas arranged in a line along the first direction I from the first contact area CTA1. M may be a natural number equal to or smaller than N. Hereinafter, for convenience of illustration, a case where the first contact area CTA1 is divided into first to fourth areas A1 to A4 arranged in a line along the first direction I and the second contact area CTA2 is divided into fifth and sixth areas A5 and A6 arranged in a line along the first direction I is illustrated as an example, embodiments of the present disclosure is not limited thereto.

The alternately stacked first and second material layers 131 and 133 may be divided into a first stacked group ML1 and a second stacked group ML2 disposed on the first stacked group ML1.

The second material layers 133 are formed of a different material from the first material layers 131. For example, the first material layers 131 may be formed of an insulating material for interlayer insulating layers, and the second material layers 133 may be formed of a conductive material for conductive patterns.

Alternatively, the first material layers 131 may be formed of an insulating material for interlayer insulating layers, and the second material layers 133 may be formed of a sacrificial insulating material having an etching selection ratio with respect to the first material layers 131. In this case, the first material layers 131 may be formed as silicon oxide layers, and the second material layers 133 may be formed as silicon nitride layers. When both the first and second material layers 131 and 133 are formed of an insulating material, it is possible to decrease the difficulty of etching processes for forming channel holes or slits.

Alternatively, the first material layers 131 may be formed of a sacrificial conductive material having an etching selection ratio with respect to the second material layers 133, and the second material layers 133 may be formed of a conductive material for conductive patterns. In this case, the first material layers 131 may be formed as undoped polysilicon layers, and the second material layers 133 may be formed as doped polysilicon layers. When both the first and second material layers 131 and 133 are formed of a conductive material, it is possible to decrease the degree of difficulty of etching processes for forming channel holes or slits.

After the first and second stacked groups ML1 and ML2 are formed, (M+N) step structures SLSTS and SW1_T arranged in a line along the first direction I are respectively formed in the first to sixth areas A1 to A6 by etching the second stacked group ML2. The step structures may include a select step structure SLSTS and upper step structures SW1_T. The select step structure SLSTS is disposed in the first area A1 most adjacent to the cell area, and the upper step structures SW1_T are disposed in the second to sixth areas A2 to A6, respectively. The select step structure SLSTS and the upper step structures SW1_T may be formed using the following process.

First, a first trench-type mask pattern TM1 including first openings through which the first to sixth areas A1 to A6 are exposed, respectively, is formed in the second stacked group ML2. After that, the select step structure SLTST and the upper step structures SW1_T are simultaneously formed by repeating a process of etching the second stacked group ML2 by using the first trench-type mask pattern TM1 as an etching barrier and a process of widening the widths of the first openings by etching the first trench-type mask pattern TM1. Each of the openings is formed in a line along the second direction II intersecting the first direction I.

The first trench-type mask pattern TM1 may be formed by using a photolithography process. The first trench-type mask pattern TM1 may be removed after the select step structure SLSTS and the upper step structures SW1_T are formed. The select step structure SLSTS and the upper step structures SW1_T are simultaneously formed by repeating the process of widening the first openings and the process of etching the second stacked group ML2. Each of the select step structure SLSTS and the upper step structures SW1_T may include a same number of steps.

Figure 11A:
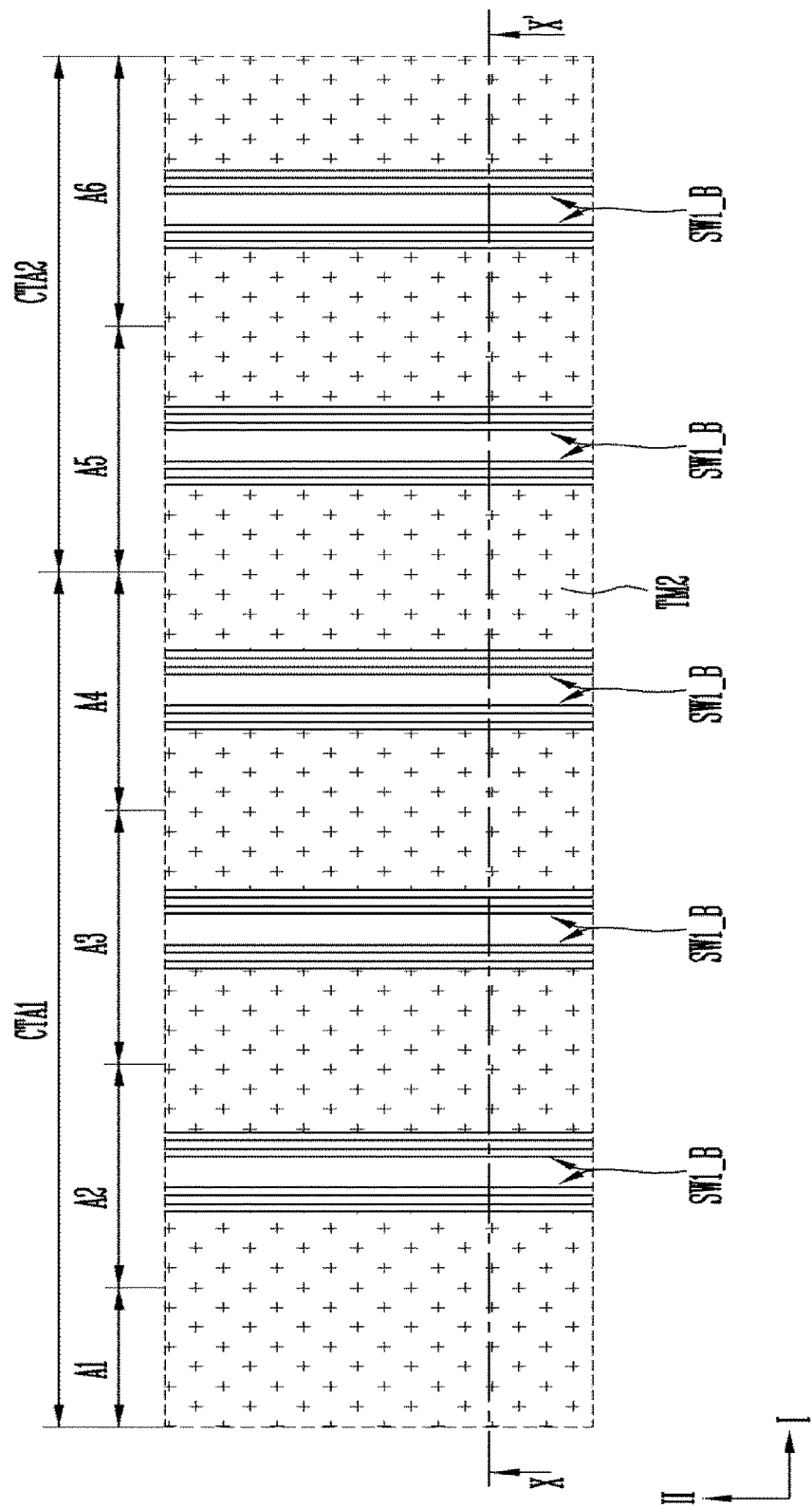
Figure 11B:
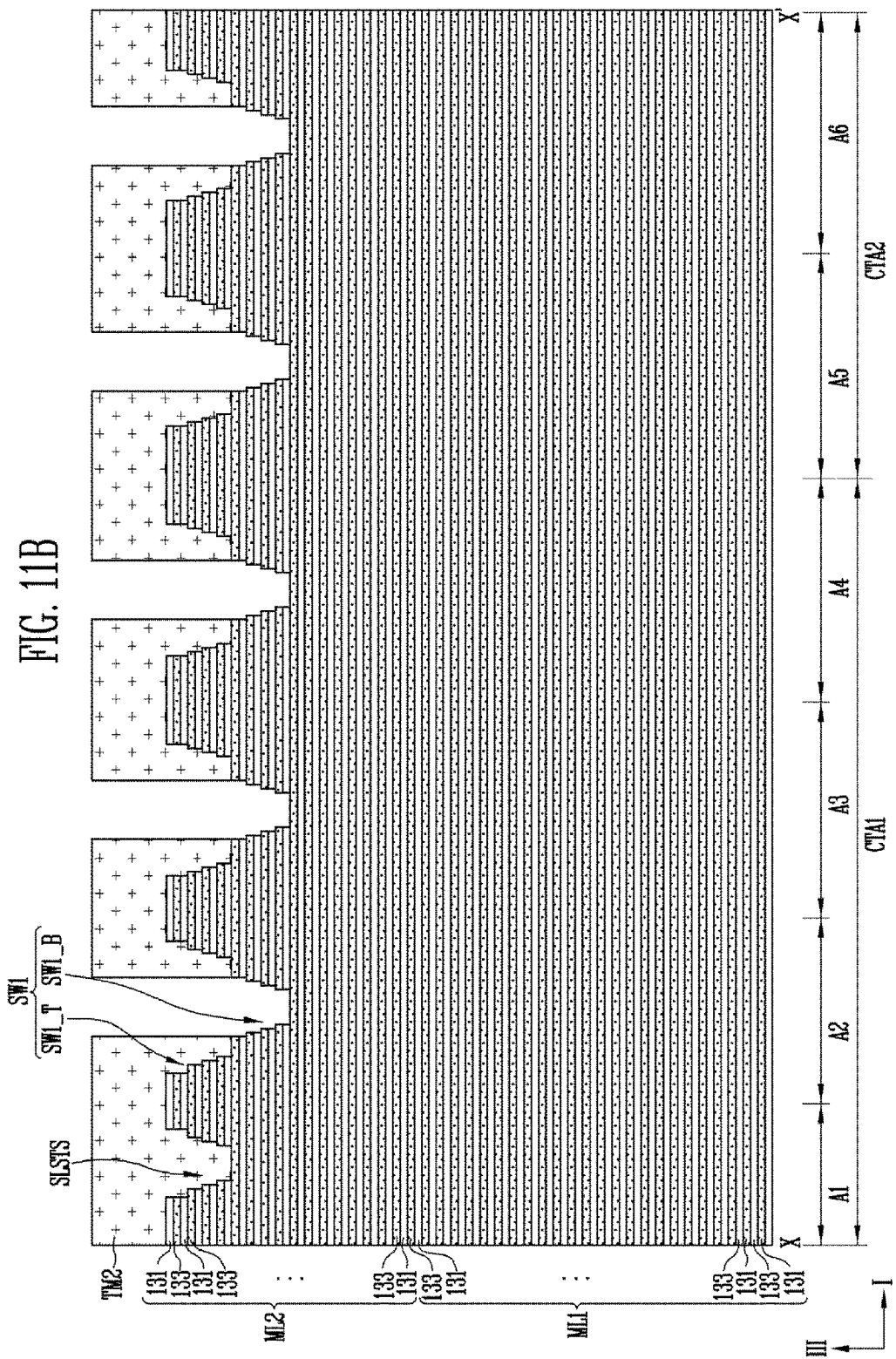

FIGS. 11A and 11B are plan and sectional views illustrating a process of forming a lower step structure of a stepped trench.

Referring to FIGS. 11A and 11B, lower step structures SW1_B are formed by etching the second stacked group ML2 exposed through bottom surfaces of the upper step structures SW1_T. Accordingly, stepped trenches are formed which include first stepped sidewalls SW1 extending down to a first depth deeper than a depth of the select step structure SLSTS. The stepped trenches are disposed in the second to sixth areas A2 to A6, respectively. The stepped trenches may be arranged in a line along the first direction I. The first stepped sidewalls SW1 are symmetrically opposite to each other in the first direction I, and each includes a lower step structure SW1_B and an upper step structure SW1_T. The first stepped sidewalls SW1 may include x steps which may be a greater number of steps than the steps of the select step structure SLSTS. Each of the x steps may include a pair of a first material layer and a second material layer.

The lower step structures SW1_B may be formed using the following process.

First, a second trench-type mask pattern TM2 for shielding the upper step structures SW1_T is formed over the second stacked group ML2. The second-trench type mask pattern TM2 is formed to shield the select step structure SLSTS. The second-trench type mask pattern TM2 includes second openings formed in a line along the second direction II. The second openings expose portions of the second stacked group ML2 exposed through bottom surfaces of the upper step structures SW1_T, and the exposed portions of the second stacked group ML2 may be disposed in the second to sixth areas A2 to A6, respectively.

After that, the lower step structures SW1_B constituting lower ends of the first stepped sidewalls SW1 are formed by repeating a process of etching the second stacked group ML2 by using the second trench-type mask pattern TM2 as an etching barrier and a process of widening the second openings by etching the second trench-type mask pattern TM2.

The second trench-type mask pattern TM2 may be formed by using a photolithography process. The second trench-type mask pattern TM2 may be removed where the first stepped sidewalls SW1 are formed.

FIGS. 12A and 12B are plan and sectional views illustrating a process of selectively depressing the stepped trenches to a second depth.

Referring to FIGS. 12A and 12B, the first stepped sidewalls SW1 of some of the stepped trenches are depressed down to a second depth, thereby forming second stepped sidewalls SW2. The second depth is deeper than the first depth at which the first stepped sidewalls SW1 are disposed.

The second stepped sidewalls SW2 may be formed using the following process.

First, a hole-type mask pattern HM including first opening holes OP1 leaving the stepped trenches open with a first area formed over the second stacked group ML2. Each of the first opening holes OP1 leaves open a pair of first stepped sidewalls SW1 opposite to each other along the first direction I. The first opening holes OP1 may be formed to expose M stepped trenches formed in the second contact area CTA2 among the stepped trenches and M stepped trenches adjacent to the second contact area CTA2 among the stepped trenches formed in the first contact area CTA1. More specifically, the first opening holes OP1 may partially expose the stepped trenches disposed in the third and fourth areas A3 and A4 of the first contact area CTA1 and the stepped trenches disposed in the fifth and sixth areas A5 and A6 of the second contact area CTA2, respectively. In other words, the hole-type mask pattern HM may partially shield each of the stepped trenches disposed on the third and fourth areas A3 and A4 of the first contact area CTA1 and the stepped trenches disposed on the fifth and sixth areas A5 and A6 of the second contact area CTA2. The hole-type mask pattern HM may be formed to completely shield the select step structure SLSTS and the stepped trench on the second area A2.

First and second inbox areas may be defined by the first opening holes OP1. The opening holes OP1 may be arranged in a zigzag pattern, so that depths of final step structures formed in one straight line along the first direction I differ.

Subsequently, the second stepped sidewalls SW2 are formed by etching the second stacked group ML2 exposed through the first opening holes OP1. When each of the first stepped sidewalls SW1 is formed with x steps, and each of the steps includes a pair of a first material layer and a second material layer, the etching process may be controlled such that one to (x+1) pairs of first material layers and second material layers may be etched when the second stacked group ML2 is etched through the first opening holes OP1. Accordingly, it is possible to prevent dummy layers not defining the first stepped sidewalls SW1 or the second stepped sidewalls SW2 from remaining between layers defining the first stepped sidewalls SW1 and layers defining the second stepped sidewalls SW2 among the first and second material layers 131 and 133.

Although the second stepped sidewalls SW2 are formed to the second depth by etching the second stacked group ML2 exposed through the first opening holes OP1, the first stepped sidewalls SW1 shielded by the hole-type mask pattern HM around the second stepped sidewalls SW2 may remain while maintaining the state in which they are disposed down to the first depth.

Figure 13A:
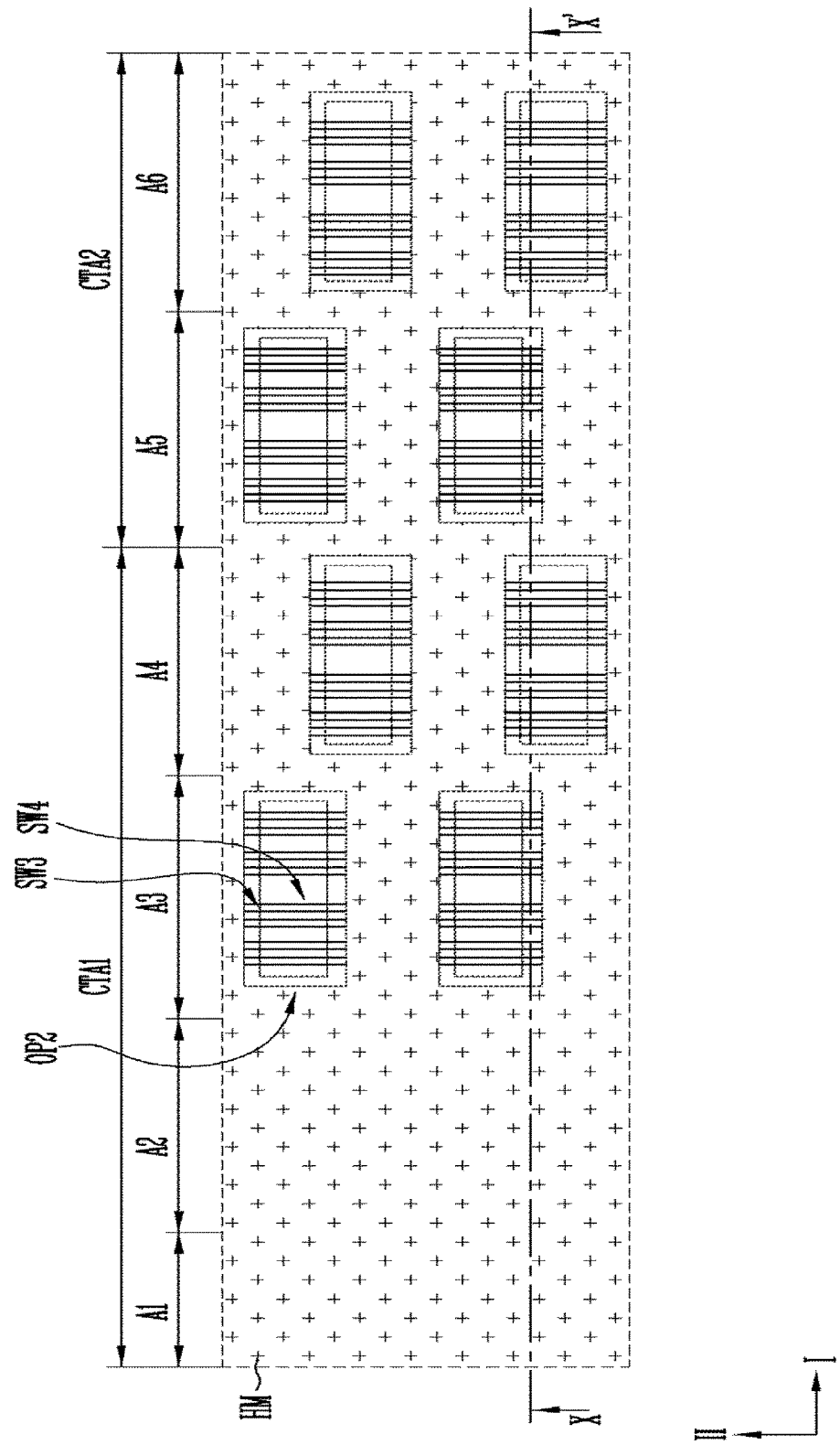
Figure 13B:
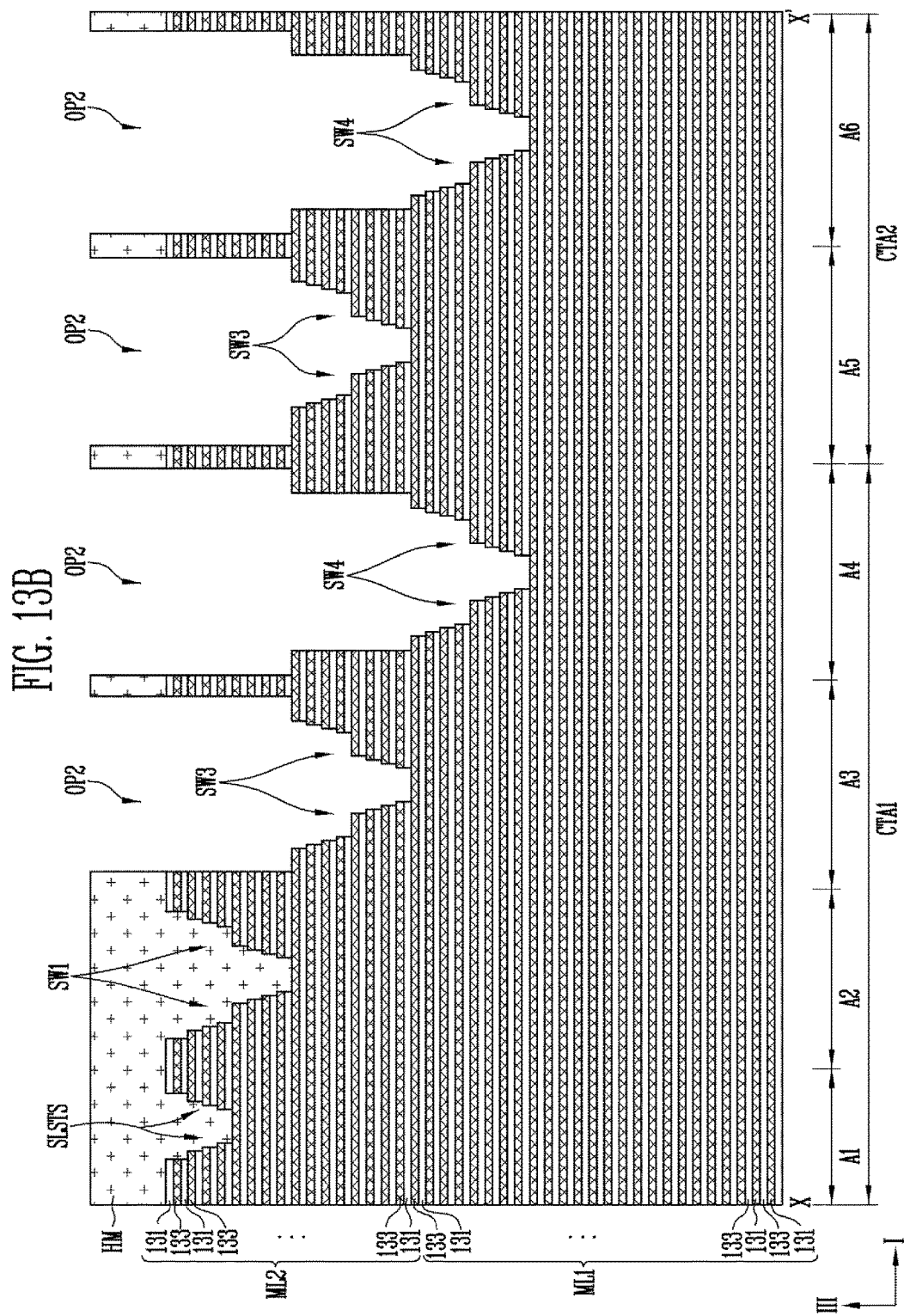

FIGS. 13A and 13B are plan and sectional views illustrating a process of selectively depressing stepped trenches to the second depth and a third depth.

Referring to FIGS. 13A and 13B, the second stepped sidewalls SW2 disposed down to the second depth, which are described in FIGS. 12A and 12B, and the first stepped sidewalls SW1 disposed down to the first depth around the second stepped sidewalls SW2 are respectively depressed down to a third depth and the second depth, thereby forming a depression structure. The depression structure may include third stepped sidewalls SW3 and fourth stepped sidewalls SW4. The fourth stepped sidewalls SW4 are formed by depressing the second stepped sidewalls SW2 shown in FIGS. 12A and 12B down to the third depth deeper than the second depth. The third stepped sidewalls SW3 are formed by depressing, down to the second depth, the first stepped sidewalls SW1 disposed in outbox areas surrounding the respective second stepped sidewalls SW2 shown in FIGS. 12A and 12B.

The third and fourth stepped sidewalls SW3 and SW4 may be formed using the following depression process. The depression process may include a process of widening the areas of the first opening holes and a process of etching the second stacked group ML2 by using a hole-type mask pattern HM as an etching barrier.

More specifically, second opening holes OP2, opening the stepped trenches including the second stepped sidewalls SW2 with a second area wider than the first area, are formed by etching the hole-type mask pattern HM. The second opening holes OP2 are formed by expanding the first opening holes OP1 shown in FIGS. 12A and 12B. The first stepped sidewalls SW1 in the outbox areas surrounding the respective second stepped sidewalls (SW2 of FIG. 12A) are exposed through the second opening holes OP2.

First and second outbox areas may be defined by the second opening holes OP2. An arrangement of the second opening holes OP2 corresponds to that of the first opening holes OP1, and the second opening holes OP2 may be arranged in a zigzag pattern along the first direction I.

Subsequently, the second stacked group ML2 is exposed through the second opening holes OP2. In this case, a depressing process may include etching the second stacked group to an etching depth equal to as a difference between the second and third depths once. Accordingly, the second stepped sidewalls SW2 may be defined as the fourth stepped sidewalls SW4 by moving the depth of the second stepped sidewalls SW2 to the third depth, and the first stepped sidewalls may be defined as the third stepped sidewalls SW3 by moving the depth of the first stepped sidewalls SW1 to the second depth. When each of the first stepped sidewalls SW1 is formed with x steps, and each of the steps includes a pair of a first material layer and a second material layer, the etching process may be controlled such that one to (x+1) pairs of first material layers and second material layers may be etched when the second stacked group ML2 is etched through the second opening holes OP2. Accordingly, it is possible to prevent dummy layers not defining the third stepped sidewalls SW3 or the fourth stepped sidewalls SW4 from remaining between layers defining the third stepped sidewalls SW3 and layers defining the fourth stepped sidewalls SW4 among the first and second material layers 131 and 133.

When the second stacked group ML2 exposed through the second opening holes OP2 is etched, a portion of the first stacked group ML1 may also be etched. In this case, the fourth stepped sidewalls SW4 may extend down inside the first stacked group ML1.

Although the fourth stepped sidewalls SW4 are formed at the third depth and the third stepped sidewalls SW3 are formed at the second depth by etching portions of the first and second material layers 131 and 133 exposed through the second opening holes OP2, the first stepped sidewalls SW1 shielded by the hole-type mask pattern HM around the third stepped sidewalls SW3 may remain and maintain the state in which the first step sidewalls SW1 are disposed down to the first depth.

The hole-type mask pattern HM may be removed after the third and fourth stepped sidewalls SW3 and SW4 are formed.

Through the above-described process, the stepped trenches including the first, third, and fourth stepped sidewalls SW1, SW3, and SW4 may be disposed in the first contact area CTA1 and the second contact area CTA2.

Figure 14B:
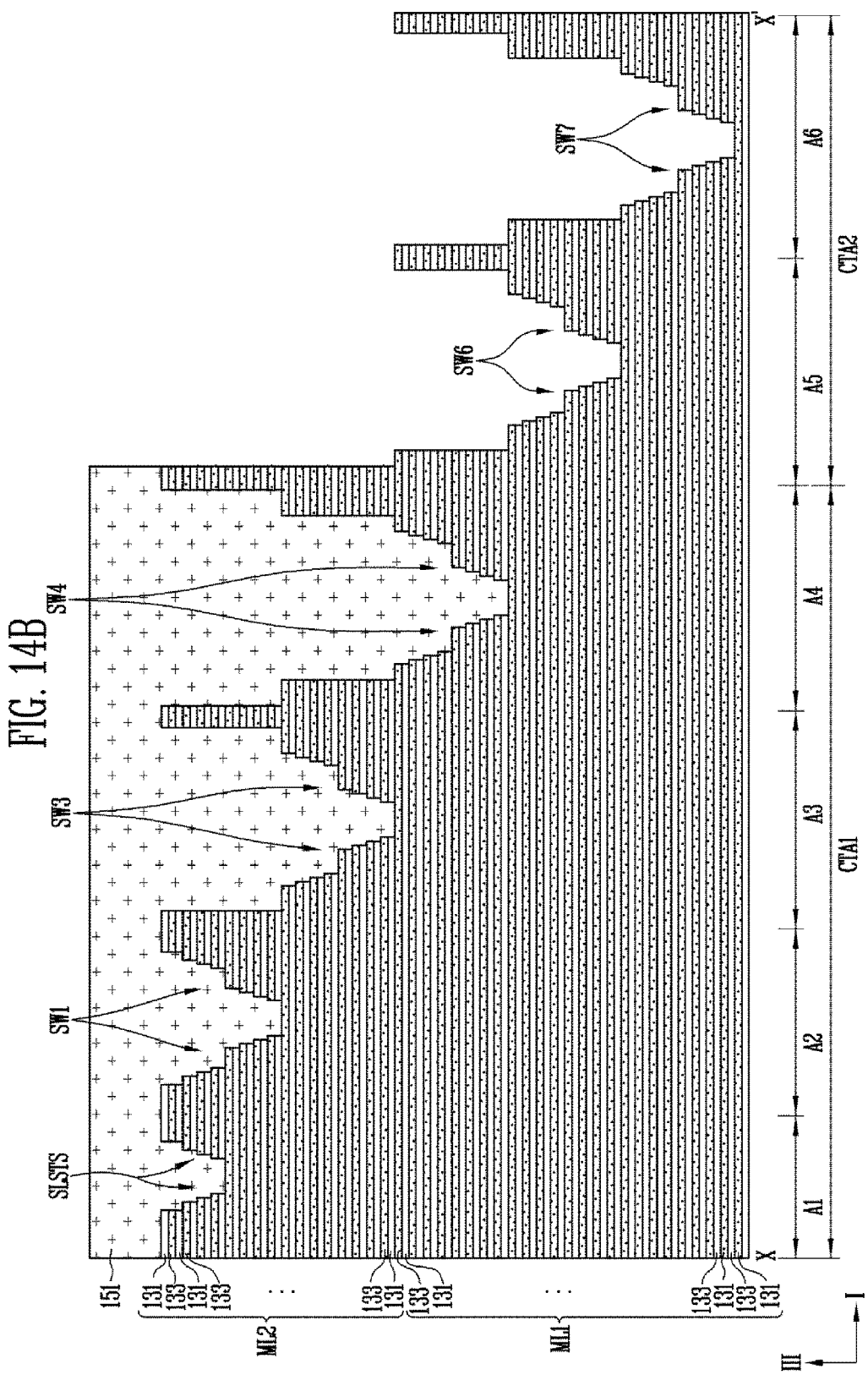

FIGS. 14A and 14B are plan and sectional views illustrating a process of removing the second stacked group in the second contact area while moving the first, third, and fourth stepped sidewalls inside the first stacked group.

Referring to FIGS. 14A and 14B, the stepped trenches including the first, third, and fourth stepped sidewalls SW1, SW3, and SW4 are formed while maintaining the first to third depths in the first contact area CTA1, and is depressed inside the first stacked group ML1 on the second contact area CTA2. The first, third, and fourth stepped sidewalls SW1, SW3, and SW4 depressed to the inside of the first stacked group ML1 are defined as fifth to seventh stepped sidewalls SW5 to SW7.

The fifth to seventh stepped sidewalls SW5 to SW7 may be formed using the following process.

First, a mask pattern 151 is formed over the second stacked group ML2. The mask pattern 151 is formed to shield the select step structure SLSTS, the first, third, and fourth stepped sidewalls SW1, SW3, and SW4, disposed in the first contact area CTA1, and is formed to leave exposed the first, third, and fourth stepped sidewalls SW1, SW3, and SW4 disposed in the second contact area CTA2.

After that, the first stacked group ML1 and the second stacked group ML2 are etched through an etching process using the mask pattern 151 as an etching barrier. Here, the etching process is performed until the lowermost first material layer 131 or the lowermost second material layer 133, disposed at the lowermost portion of the first stacked group ML1 is exposed. Accordingly, the fifth to seventh stepped sidewalls SW5 to SW7 may be formed by moving the first, third, and fourth stepped sidewalls SW1, SW3, and SW4 inside the first stacked group ML1.

When the etching process for forming the fifth to seventh stepped sidewalls SW5 to SW7 is performed, the second stacked group ML2 may be removed so as not to remain in the second contact area CTA2. Thus, the aspect ratio of each of the stepped grooves HSTS each including the fifth to seventh stepped sidewalls SW5 to SW7 is defined by the first stacked group ML1. As a result, in an embodiment of the present disclosure, the aspect ratio of each of the stepped grooves HSTS may be reduced as compared with the stepped grooves penetrating the first and second stacked groups ML1 and ML2. Accordingly, when a photoresist layer coating process and the like are subsequently performed, it is possible to reduce defects occurring due to a high aspect ratio of each stepped groove.

The mask pattern 151 may be removed after the stepped grooves HSTS are formed.

FIGS. 15A and 15B are plan and sectional views illustrating a process of forming a stacked structure of interlayer insulating layers and conductive patterns, which constitute memory blocks.

Referring to FIGS. 15A and 15B, a planarization insulating layer 161 covering the select step structure SLSTS and first, third, and fourth to seventh stepped sidewalls SW1, SW3, and SW4 to SW7 is formed over the first and second stacked groups ML1 and ML2. Subsequently, slits SI are formed which penetrate the first and second stacked groups ML1 and ML2 to divide the first and second stacked groups ML1 and ML2 in units of memory blocks MB.

When the first material layers 131 are formed as interlayer insulating layers and the second material layers 133 are formed of a conductive material for conductive patterns, interlayer insulating layers ILD formed as the first material layers 131 are isolated by the slits SI, and conductive patterns CP formed as the second material layers 133 are isolated by the slits SI.

When the first material layers 131 are formed as interlayer insulating layers and the second material layers 133 are formed as sacrificial insulating layers, the second material layers 133 may be removed through the slit SI, and areas in which the second material layers 133 are removed may be filled with the conductive patterns CP that are third material layers.

When the first material layers 131 are formed of a sacrificial conductive material and the second material layers 133 are formed of a conductive material for conductive patterns, the first material layers 131 may be removed through the slit SI, and areas in which the first material layers 131 are removed may be filled with the interlayer insulating layers ILD that are third material layers.

Through the processes described with reference to FIGS. 10A to 15B, the select step structure SLSTS and first to fifth word line step structures WLSTS1 to WLSTS5 are disposed in the first to sixth areas A1 to A6, respectively.

The select step structure SLSTS may be defined through the process described in FIGS. 10A and 10B. The first word line step structure WLSTS1 may include the first stepped sidewalls SW1 defined through the processes in FIGS. 10A to 11B. Each of the second and third word line step structures WLSTS2 and WLSTS3 may include the first, third, and fourth stepped sidewalls SW1, SW3, and SW4 defined through the processes described in FIGS. 10A to 13B, the first, third, and fourth stepped sidewalls SW1, SW3, and SW4 being depressed in stages. Each of the fourth and fifth word line step structures WLSTS4 and WLSTS5 may include the fifth to seventh stepped sidewalls SW5 to SW7 defined through the processes described in FIGS. 10A to 14B, the fifth to seventh stepped sidewalls SW5 to SW7 being depressed in stages.

FIG. 16 is a sectional view illustrating a depressing process according to an embodiment of the present disclosure. In other words, FIG. 16 illustrates a modified embodiment of the depressing process shown in FIGS. 13A and 13B.

Referring to FIG. 16, a depression structure including first stepped sidewalls disposed down to a first depth and second stepped sidewalls disposed down to a second depth D2 deeper than the first depth is formed inside the second stacked group ML2 by using the processes described in FIGS. 10A to 12B.

After that, the second stepped sidewalls disposed down to the second depth D2 and the first stepped sidewalls disposed down to the first depth around the second stepped sidewalls are depressed down to a third depth D3 and the second depth D2, respectively, thereby forming a depression structure. The depression structure may include third stepped sidewalls SW3 and fourth stepped sidewalls SW4. The fourth stepped sidewalls SW4 are formed by depressing the second stepped sidewalls SW2 shown in FIGS. 12A and 12B down to the third depth D3 deeper than the second depth D2. The third stepped sidewalls SW3 are formed by depressing, down to the second depth D2, the first stepped sidewalls SW1 disposed in the outbox area surrounding each of the second stepped sidewalls SW2 shown in FIGS. 12A and 12B.

The third and fourth stepped sidewalls SW3 and SW4 may be formed using the following depressing process. The depressing process may be performed by repeatedly performing, twice or more, a process of widening areas of first opening holes OP1 and a process of etching the second stacked group ML2 by using a hole-type mask pattern HM as an etching barrier. In this case, the process of etching the second stacked group ML2 may be performed by etching the second stacked group ML2 to a depth less than a difference between the second depth D2 and the third depth D3.

More specifically, second opening holes OP2 open stepped trenches including the second stepped sidewalls SW2 with a second area wider than the first area by etching the hole-type mask pattern HM. The second opening holes OP2 are formed by expanding the first opening holes OP1 shown in FIGS. 12A and 12B. The first stepped sidewalls SW1 in the outbox area surrounding each of the second stepped sidewalls SW2 are exposed through the second opening holes OP2.

Subsequently, the second stacked group ML2 exposed through the second opening holes OP2 is etched. Here, the etching depth of the second stacked group ML2 is shallower than the etching depth described in FIGS. 13A and 13B, and therefore, each of the first stepped sidewalls SW1 and the second stepped sidewalls SW2 is moved to a depth shallower than a desired depth. In this case, the hole-type mask pattern HM is etched to widen the area of the second opening holes OP2 to a third area wider than the second area, thereby forming third opening holes OP3. After that, the second stacked group ML2 exposed through the third opening holes OP3 is etched. Accordingly, the fourth stepped sidewalls SW4 may be defined by moving the second stepped sidewalls SW2 to the third depth D3, and the third stepped sidewalls SW3 may be defined by moving the first stepped sidewalls SW1 to the second depth D2.

As described above, when the process of etching the hole-type mask pattern HM and the process of etching the second stacked group ML2 are repeatedly performed twice or more so as to move the second stepped sidewalls SW2 to the third depth D3 and move the first stepped sidewalls SW1 to the second depth D2, a dummy step structure DSTS may be defined between the third and fourth stepped sidewalls SW3 and SW4 adjacent to each other in the first direction I. In the process of forming the dummy step structure DSTS, the uppermost area of a stepped grooves defined by the third stepped sidewalls SW3 or the fourth stepped sidewalls SW4 may be widened. Accordingly, the aspect ratio of the stepped groove defined by the third stepped sidewalls SW3 or the fourth stepped sidewalls SW4 is reduced, and thus subsequent processes including a photoresist pattern coating process and the like may be easily performed.

The subsequent processes are the same as described in FIGS. 14A to 15B.

FIGS. 17A to 20B are views illustrating a method of forming a memory block of a semiconductor device according to an embodiment of the present disclosure. FIGS. 17B, 18B, 19B, and 20B are sectional views taken along lines "X-X'" shown in FIGS. 17A, 18A, 19A, and 20A, respectively.

Figure 17A:
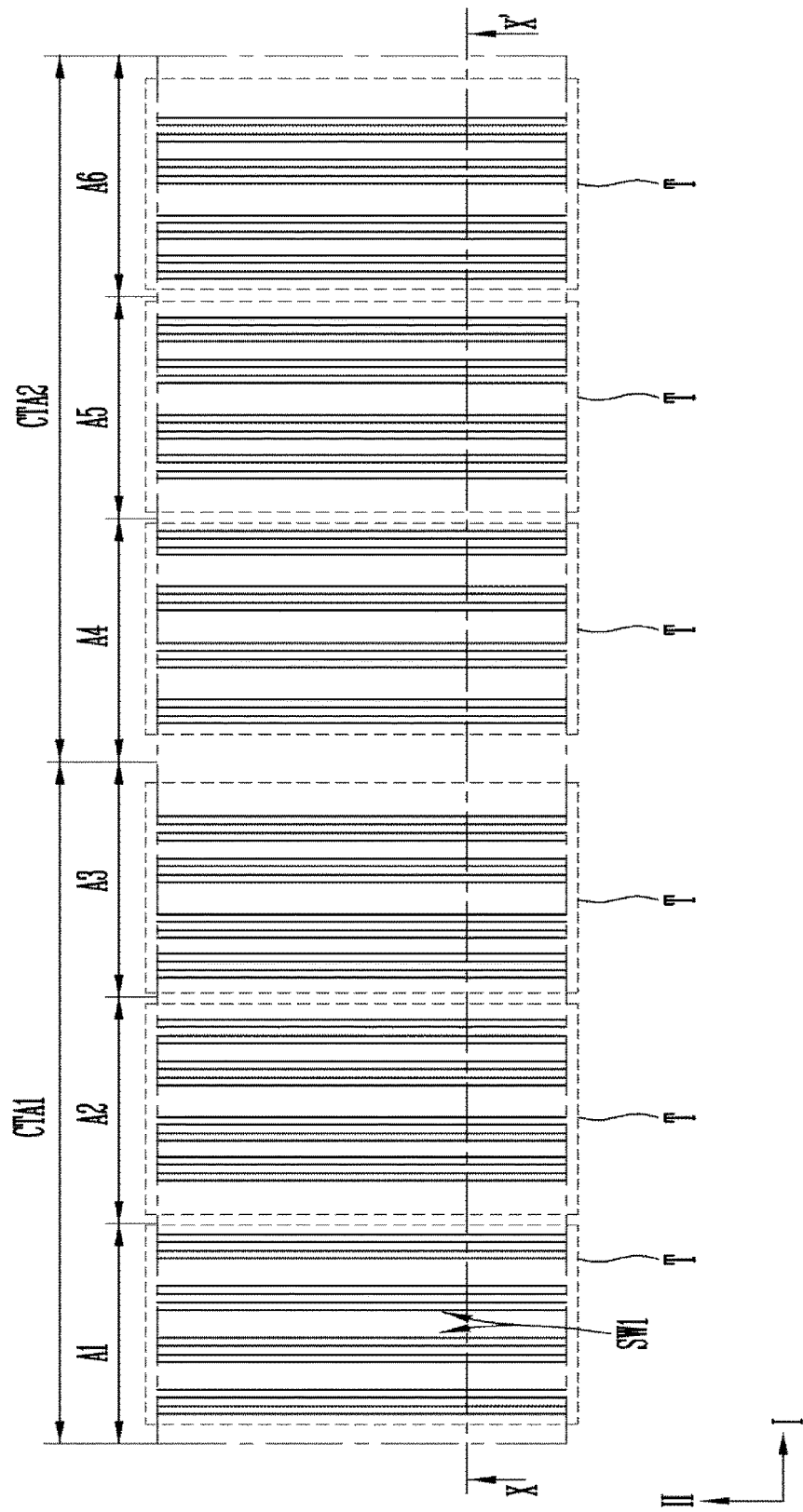

FIGS. 17A and 17B are plan and sectional views illustrating a process of forming stepped trenches.

Referring to FIGS. 17A and 17B, first material layers 231 and second material layers 233 are alternately stacked over a substrate including a first contact area CTA1 extending along the first direction I from a cell area (not shown) and a second contact area CTA2 extending along the first direction I from the first contact area CTA1.

The first contact area CTA1 may be divided into N areas arranged in a line along the first direction I from the cell area. The second contact area CTA2 may be divided into M areas arranged in a line along the first direction I from the first contact area CTA1. M may be a natural number equal to or smaller than N. Hereinafter, for convenience of illustration, a case where the first contact area CTA1 is divided into first to third areas A1 to A3 arranged in a line along the first direction I and the second contact area CTA2 is divided into fourth to sixth areas A4 to A6 arranged in a line along the first direction I is illustrated as an example, an embodiment of the present disclosure is not limited thereto.

The alternately stacked first and second material layers 231 and 233 may be divided into a first stacked group ML1 and a second stacked group ML2 disposed on the first stacked group ML1.

The second material layers 233 and the first material layers 231 may be formed from the materials described in FIGS. 10A and 10B.

After the first and second stacked groups ML1 and ML2 are formed, (M+N) stepped trenches T arranged in a line along the first direction I are respectively formed in the first to sixth areas A1 to A6 by etching the second stacked group ML2. Each of the stepped trenches T may include first stepped sidewalls SW1 symmetrically opposite to each other in the first direction I, the first stepped sidewalls SW1 extending down to a first depth.

The stepped trenches T may be formed by repeating a process of etching the second stacked group ML2 by using, as an etching barrier, a trench-type mask pattern (not shown) including openings formed in a line along the second direction II and a process of widening the widths of the openings.

Each of the first stepped sidewalls SW1 may include x steps. Each of the x steps may include a pair of a first material layer and a second material layer.

The trench-type mask pattern may be formed by using a photolithography process. The trench-type mask pattern may be removed after the stepped trenches T are formed.

Figure 18B:
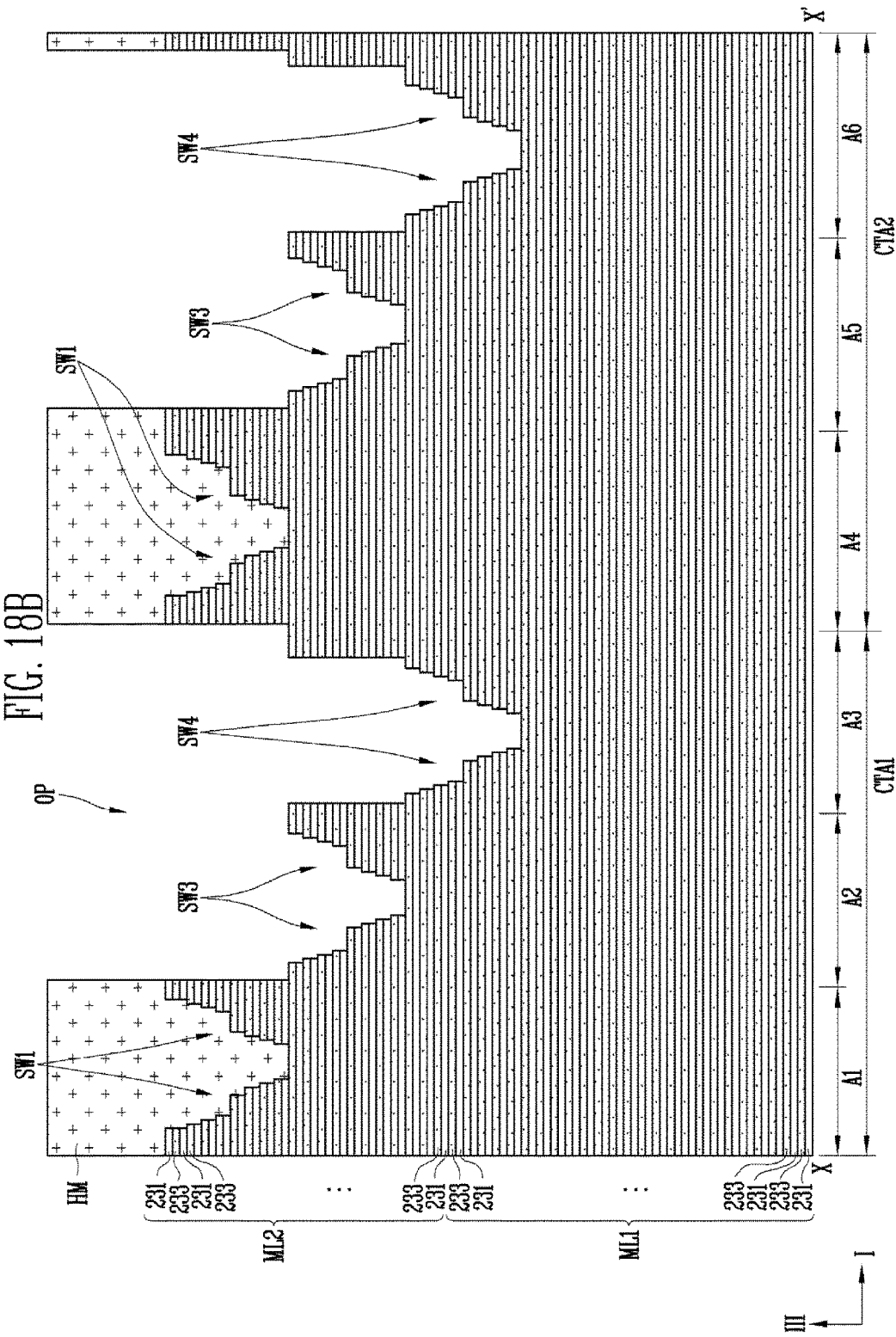

FIGS. 18A and 18B are plan and sectional views illustrating a process of depressing, in stages, at least one of the stepped trenches to a second depth and a third depth.

Referring to FIGS. 18A and 18B, the second stacked group ML2 is etched to have a depression structure in which at least one stepped trench disposed in each of the first and second contact areas CTA1 and CTA2 among the stepped trenches T are depressed in stages to a second depth deeper than the first depth, where the first stepped sidewalls SW1 are disposed at a third depth deeper than the second depth. The depression structure may include third stepped sidewalls SW3 and fourth stepped sidewalls SW4. The third stepped sidewalls SW3 are formed by depressing a portion of the first stepped sidewalls SW1 down to the second depth. The fourth stepped sidewalls SW4 are formed by depressing a portion of the third stepped sidewalls SW3 down to the third depth.

The depression structure may be formed using the following process.

First, a hole-type mask pattern HM including openings holes (not shown) opening the stepped trenches T with a first area is formed over the second stacked group ML2. Each of the opening holes of the first area opens a pair of first stepped sidewalls SW1 opposite to each other in the first direction I. The opening holes of the first area may be formed to expose (M-1) stepped trenches formed in the second contact area CTA2 among the stepped trenches and (M-1) stepped trenches adjacent to the second contact area CTA2 among the stepped trenches formed in the first contact area CTA1. More specifically, the opening holes of the first area may partially expose stepped trenches disposed in the second and third areas A2 and A3 of the first contact area CTA1 and stepped trenches disposed in the fifth and sixth areas A5 and A6 of the second contact area CTA2, respectively. In other words, the hole-type mask pattern HM may partially shield each of the stepped trenches disposed in the second and third areas A2 and A3 of the first contact area CTA1 and the stepped trenches disposed on the fifth and sixth areas A5 and A6 of the second contact area CTA2. The hole-type mask pattern HM may be formed to completely shield a stepped trench in the first area A1 and a stepped trench in the fourth area A4.

Inbox areas IB may be defined by the opening holes of the first area. The opening holes of the first area may be arranged in a zigzag pattern, so that depths of final step structures to be formed in one straight line along the first direction I are formed different.

Subsequently, second stepped sidewalls (not show) are formed in the inbox areas IB by etching the second stacked group ML2 exposed through the opening holes of the first area. The second stepped sidewalls are defined by moving the first stepped sidewalls SW1 to the second depth deeper than the first depth inside the inbox areas IB. When each of the first stepped sidewalls SW1 is formed with x steps, and each of the steps includes a pair of a first material layer and a second material layer, the etching process may be controlled such that one to (x+1) pairs of first material layers and second material layers may be etched when the second stacked group ML2 is etched through the opening holes of the first area. Accordingly, it is possible to prevent dummy layers not defining the first stepped sidewalls SW1 or the second stepped sidewalls from remaining between layers defining the first stepped sidewalls SW1 and layers defining the second stepped sidewalls among the first and second material layers 231 and 233.

After that, the opening holes of the first area are widened to have a second area wider than the first area by etching the hole-type mask pattern HM. Opening holes OP of the second area, which are adjacent to each other in the first direction I, may be connected to each other. Outbox areas OB surrounding the respective inbox areas IB may be defined by the opening holes OP of the second area.

Subsequently, third stepped sidewalls SW3 and fourth stepped sidewalls SW4 are formed by etching the second stacked group ML2 exposed through the opening holes OP of the second area. The third stepped sidewalls SW3 are formed by moving the first stepped sidewalls to the second depth in the outbox areas OB, and the fourth stepped sidewalls SW4 are formed by moving the second stepped sidewalls to the third depth in the inbox areas IB. When each of the first stepped sidewalls SW1 is formed with x steps, and each of the steps includes a pair of a first material layer and a second material layer, the etching process may be controlled such that one to (x+1) pairs of first material layers and second material layers may be etched when the second stacked group ML2 is etched through the opening holes OP of the second area. Accordingly, it is possible to prevent dummy layers not defining the third stepped sidewalls SW3 or the fourth stepped sidewalls SW4 from remaining between layers defining the third stepped sidewalls SW3 and layers defining the fourth stepped sidewalls SW4 among the first and second material layers 231 and 233.

When the second stacked group ML2 exposed through the opening holes OP of the second area is etched, a portion of the first stacked group ML1 may be etched. In this case, the fourth stepped sidewalls SW4 may extend down inside the first stacked group ML1.

Although the fourth stepped sidewalls SW4 are formed to the third depth and the third stepped sidewalls SW3 are formed to the second depth by etching some of the first and second material layers 231 and 233 exposed through the opening holes OP of the second area, the first stepped sidewalls SW1 shielded by the hole-type mask pattern HM around the third stepped sidewalls SW3 may remain while maintaining the state in which the first stepped sidewalls SW1 are disposed down to the first depth. When the opening holes OP of the second area, which are adjacent to each other in the first direction I, are connected to each other, the outbox areas OB adjacent to each other in the first direction I may be connected to each other. In this case, the height of the second stacked group ML2 remaining between the outbox areas OB is lowered, and thus subsequent processes including a photoresist pattern coating process and the like may be easily performed.

The hole-type mask pattern HM may be removed after the third and fourth stepped sidewalls SW3 and SW4 are formed.

Through the above-described processes, the stepped trenches including the first, third, and fourth stepped sidewalls SW1, SW3, and SW4 may be disposed on each of the first contact area CTA1 and the second contact area CTA2.

Figure 19A:
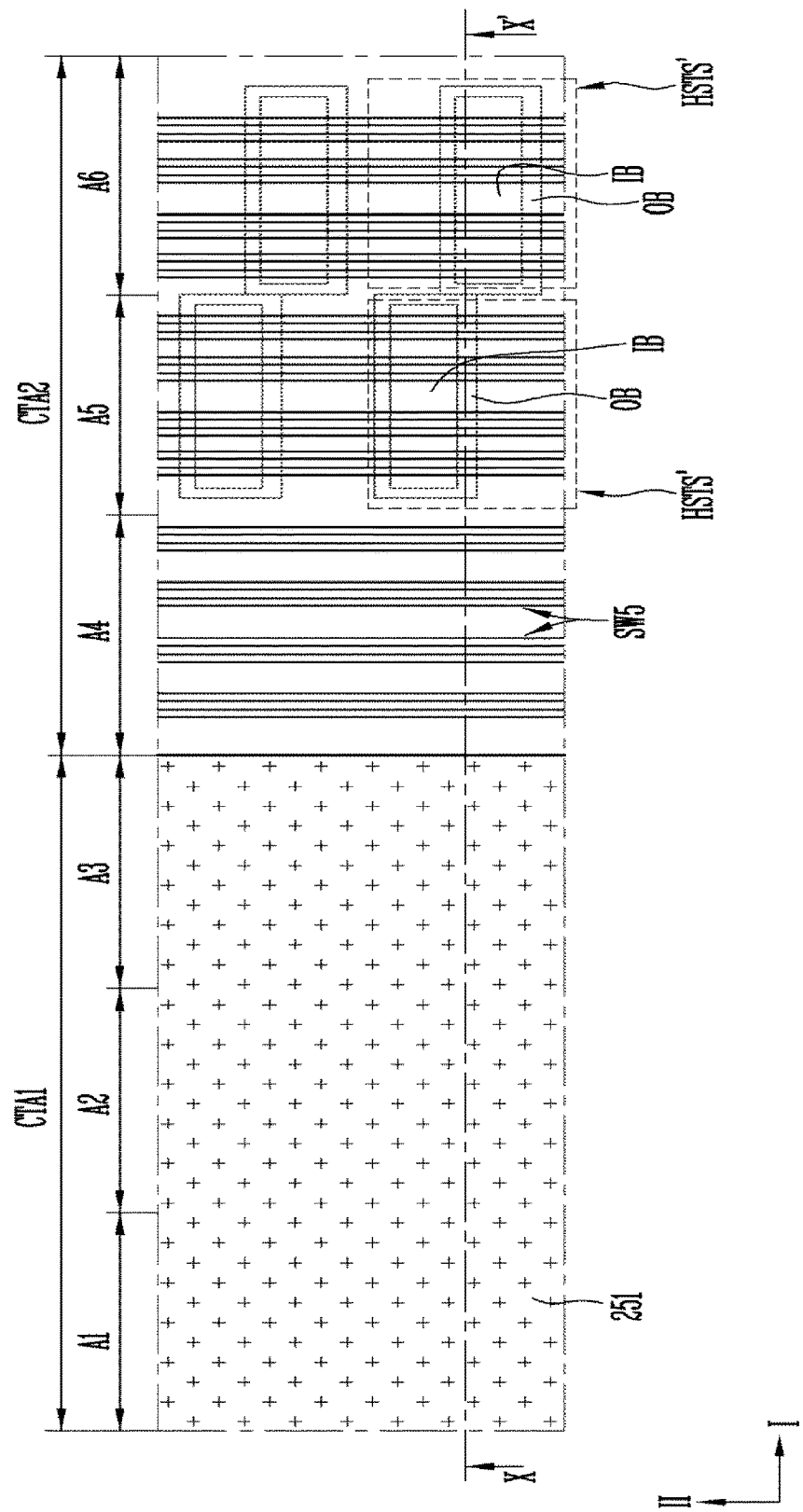
Figure 19B:
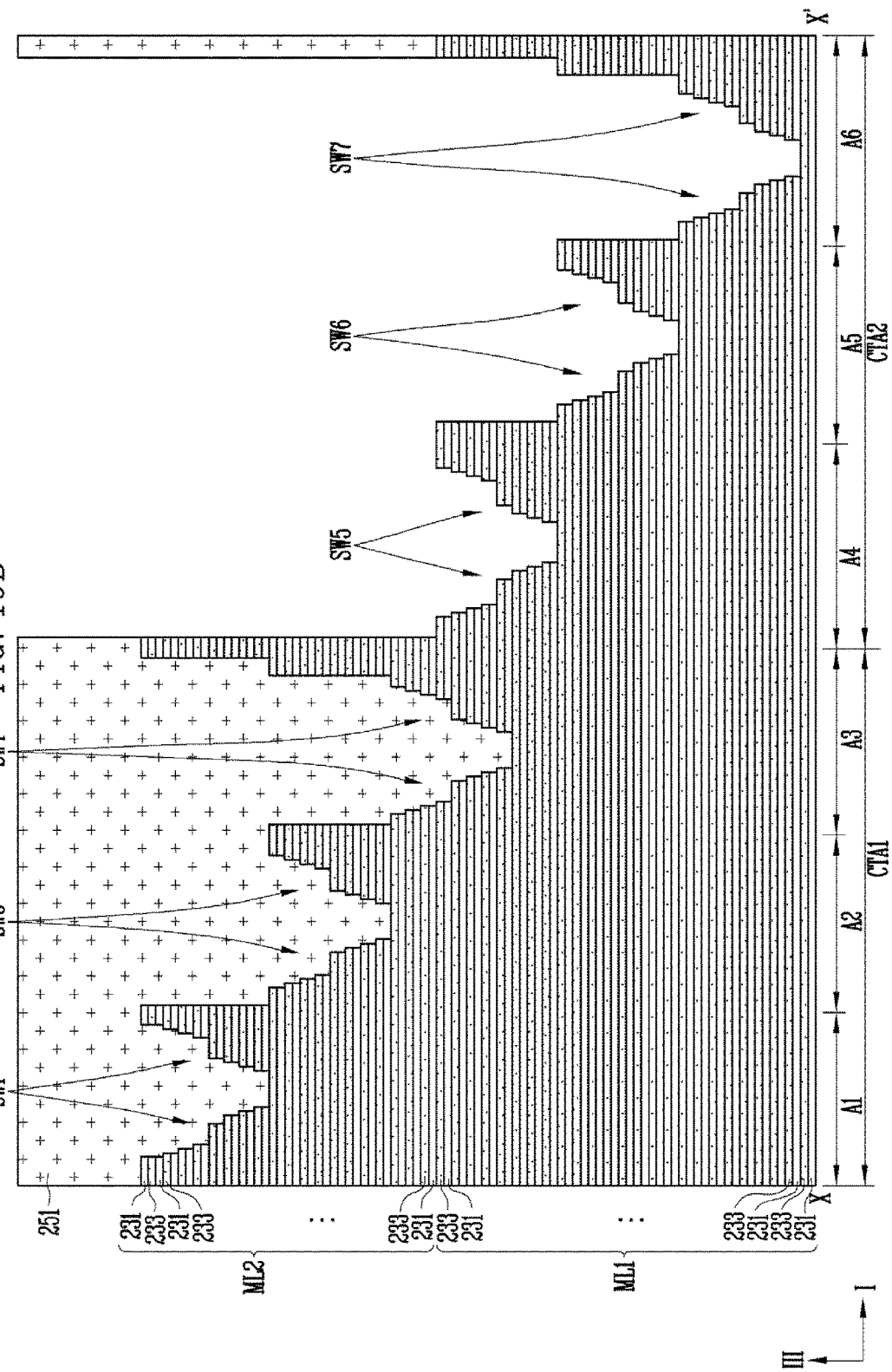

FIGS. 19A and 19B are plan and sectional views illustrating a process of the second stacked group disposed in the second contact area while moving the first, third, and fourth stepped sidewalls inside the first stacked group.

Referring to FIGS. 19A and 19B, the stepped trenches including the first, third, and fourth stepped sidewalls SW1, SW3, and SW4 maintain the first to third depths in the first contact area CTA1, and are depressed inside the first stacked group ML1. The first, third, and fourth stepped sidewalls SW1, SW3, and SW4 depressed inside the first stacked group ML1 are defined as fifth to seventh stepped sidewalls SW5 to SW7, respectively.

The fifth to seventh stepped sidewalls SW5 to SW7 may be formed using the following process.

First, a mask pattern 251 is formed over the second stacked group ML2. The mask pattern 251 is formed to completely shield the first, third, and fourth stepped sidewalls SW1, SW3, and SW4 disposed in the first contact area CTA1 and expose the first, third, and fourth stepped sidewalls SW1, SW3, and SW4 disposed in the second contact area CTA2.

After that, the first stacked group ML1 and the second stacked group ML2 are etched through an etching process using the mask pattern 251 as an etching barrier. Here, the etching process is performed until the lowermost first material layer 231 or the lowermost second material layer 233, disposed at the lowermost portion of the first stacked group ML1, among the first material layers 231 and the second material layers 233 is exposed. Accordingly, the fifth to seventh stepped sidewalls SW5 to SW7 may be formed by moving the first, third, and fourth stepped sidewalls SW1, SW3, and SW4 inside the first stacked group ML1.

When the etching process for forming the fifth to seventh stepped sidewalls SW5 to SW7 is performed, the second stacked group ML2 may be removed so as not to remain in the second contact area CTA2. Thus, the aspect ratio of each of stepped grooves HSTS' each including the fifth to seventh stepped sidewalls SW5 to SW7 is defined by the first stacked group ML1. As a result, in the embodiment of the present disclosure, the aspect ratio of each of the stepped grooves HSTS' may be reduced as compared with the stepped grooves penetrating both the first and second stacked groups ML1 and ML2. Accordingly, when a photoresist layer coating process and the like is subsequently performed, it is possible to reduce defects occurring due to a high aspect ratio of each stepped groove.

The mask pattern 251 may be removed after the stepped grooves HSTS' are formed.

Figure 20A:
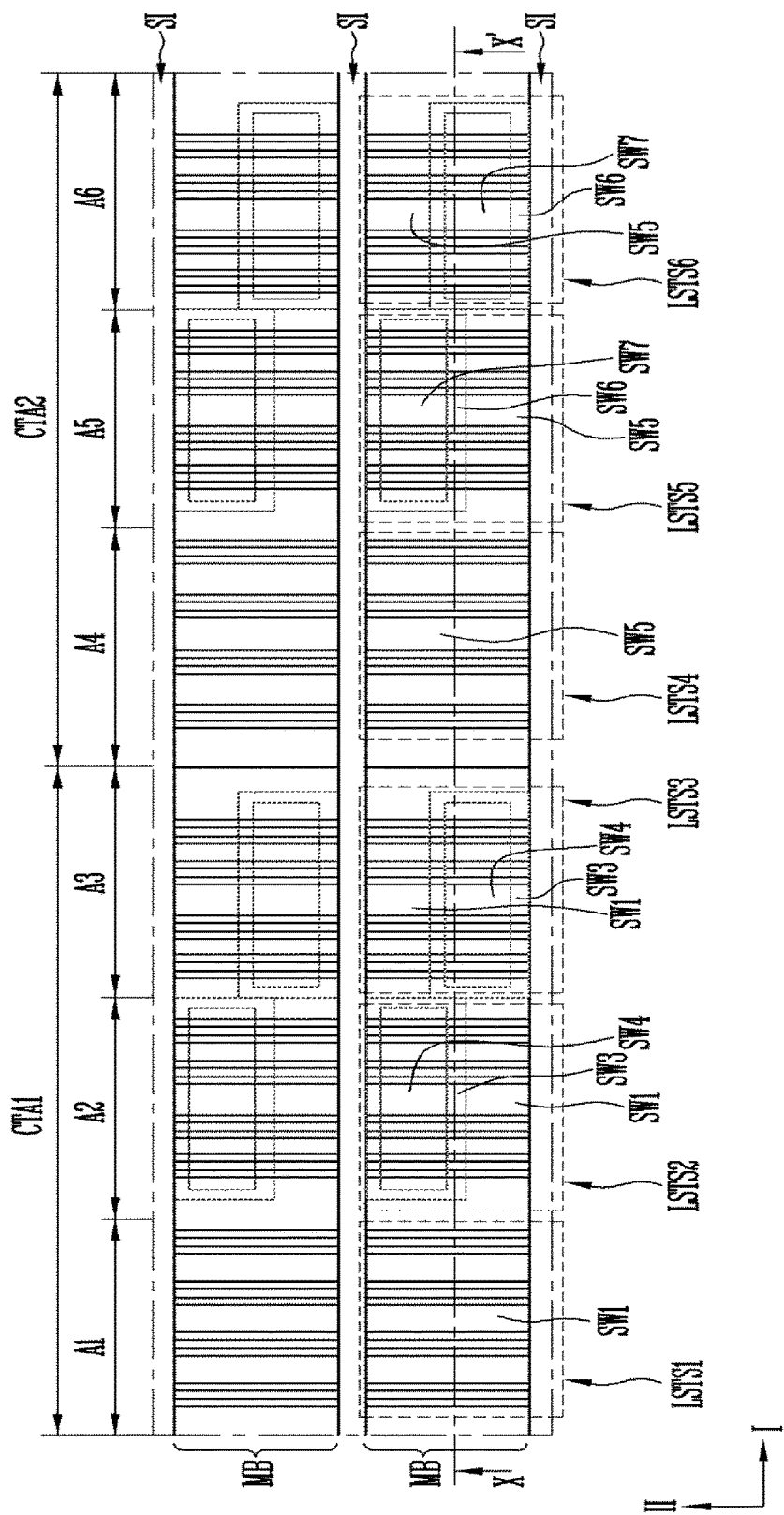

FIGS. 20A and 20B are plan and sectional views illustrating a method of forming a stacked structure of interlayer insulating layers and conductive patterns, which constitute memory blocks.

Referring to FIGS. 20A and 20B, a planarization insulating layer 261 covering the first, third, and fourth to seventh stepped sidewalls SW1, SW3, and SW4 to SW7 is formed over the first and second stacked groups ML1 and ML2. Subsequently, slits SI are formed which isolate the first and second stacked groups ML1 and ML2 in units of memory blocks MB by penetrating the first and second stacked groups ML1 and ML2. A process of replacing the first material layers 231 or the second material layers 233 with third material layers may be further performed according to properties of the first material layers 231 and the second material layers 233.

Interlayer insulating layers ILD and conductive patterns CP, which are isolated by the slits SI, may be formed using the above-described processes. Various embodiments for forming the interlayer insulating layers ILD and the conductive patterns CP are the same as described in FIGS. 15A and 15B.

Through the processes described with reference to FIGS. 17A to 20B, stepped grooves LSTS1 to LSTS6 may be disposed in the first to sixth areas A1 to A6, respectively.

The stepped grooves may be divided into first to third stepped grooves LSTS1 to LSTS3 disposed in the first contact area CTA1 and fourth to sixth stepped grooves LSTS4 to LSTS6 disposed in the second contact area CTA2. The first stepped groove LSTS1 may include a first stepped sidewall SW1 disposed in the first area A1 of the first contact area CTA1, the first stepped sidewall SW1 being defined through the process described in FIGS. 17A and 17B. The second stepped groove LSTS2 and the third stepped groove LSTS3 are disposed in the second and third areas A2 and A3 of the first contact area CTA1, respectively. The second stepped groove LSTS2 and the third stepped groove LSTS3 may include first, third, and fourth stepped sidewalls SW1, SW3, and SW4 defined through the processes described in FIGS. 17A to 18B, the first, third, and fourth stepped sidewalls SW1, SW3, and SW4 being depressed in stages. The fourth stepped groove LSTS4 may include a fifth stepped sidewall SW5 disposed on the fourth area A4 of the second contact area CTA2, the fifth stepped sidewall SW5 being defined through the process described in FIGS. 17A and 17B and the process described in FIGS. 19A and 19B. The fifth stepped groove LSTS5 and the sixth stepped groove LSTS6 are disposed in the fifth and sixth areas A5 and A6 of the second contact area CTA2, respectively. The fifth stepped groove LSTS5 and the sixth stepped groove LSTS6 may include fifth, sixth, and seventh stepped sidewalls SW5, SW6, and SW7 defined through the processes described in FIGS. 17A to 19B, the fifth, sixth, and seventh stepped sidewalls SW5, SW6, and SW7 being depressed in stages.

In an embodiment of the present disclosure, a stacked structure including interlayer insulating layers and conductive patterns, which are penetrated by stepped grooves and are alternately stacked, is formed on first and second contact areas adjacent to each other. Accordingly, it is possible to provide an area in which contact plugs may be connected to the conductive patterns through the stepped grooves.

In an embodiment of the present disclosure, the stacked structure is formed lower in the second contact area than in the first contact area. Accordingly, it is possible to reduce the aspect ratio of each of the second stepped grooves disposed in the second contact area, which is depressed deeply inside the stacked structure, as compared with first stepped grooves disposed in the first contact area, thereby decreasing the degree of difficulty of a manufacturing process of a semiconductor device.

FIG. 21 is a configuration view illustrating a memory system according to an embodiment of the present disclosure.

Referring to FIG. 21, the memory system 1100 according to the embodiment of the present disclosure includes a memory device 1120 and a memory controller 1110.

The memory device 1120 has a structure described in the embodiments described in FIGS. 1 to 20B. Schematically, the memory device 1120 includes a stacked structure having interlayer insulating layers and conductive patterns, which are alternately stacked. The stacked structure is stacked lower in a second contact area than in a first contact area. The memory device 1120 includes stepped grooves formed inside the stacked structure to open the conductive patterns. Also, the memory device 1120 may be a multi-chip package formed of a plurality of flash memory chips.

The memory controller 1110 is configured to control the memory device 1120, and may include an SRAM 1111, a CPU 1112, a host interface 1113, an ECC 1114, and a memory interface 1115. The SRAM 1111 is used as an operation memory of the CPU 1112, the CPU 1112 performs a general control operation for data exchange of the memory controller 1110, and the host interface 1113 includes a data exchange protocol for a host connected with the memory system 1100. The ECC 1114 detects and corrects an error included in a data read from the memory device 1120, and the memory interface 1115 interfaces with the memory device 1120. In addition, the memory controller 1110 may further include a ROM for storing code data for interfacing with the host, and the like.

The memory system 1100 configured as described above may be a memory card or a solid state disk (SSD), in which the memory device 1120 is combined with the controller 1110. For example, when the memory system 1100 is an SSD, the memory controller 1110 may communicate with the outside (e.g., the host) through one among various interface protocols, such as USB, MMC, PCI-E, SATA, PATA, SCSI, ESDI, and IDE.

FIG. 22 is a configuration view illustrating a computing system according to an embodiment of the present disclosure.

Referring to FIG. 22, the computing system 1200 according to the embodiment of the present disclosure may include a CPU 1220, a RAM 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a camera image processor (CIS), a mobile D-RAM, and the like may be further included.

The memory system 1210, as described with reference to FIG. 21, may be configured with a memory device 1212 and a memory controller 1211.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a semiconductor device, the method comprising:
    forming a first stacked group over a substrate, wherein the substrate includes a cell area, a first contact area extending along a first direction from the cell area, and a second contact area extending along the first direction from the first contact area;
    forming a second stacked group on the first stacked group;
    forming stepped trenches by etching the second stacked group, wherein the stepped trenches are arranged in a line along the first direction and each includes first stepped sidewalls symmetrically opposite to each other in the first direction, the first stepped sidewalls having a first depth;
    etching the second stacked group to have a depression structure in which at least one of the stepped trenches is depressed in stages to a second depth deeper than the first depth and a third depth deeper than the second depth on the first and second contact areas; and
    etching the first and second stacked groups such that the stepped trenches including the depression structure are moved to the inside of the first stacked group in the second contact area, and the second stacked group is removed in the second contact area.

2. The method of claim 1, wherein the forming of the stepped trenches includes:
    forming a trench-type mask pattern over the second stacked group, wherein the trench-type mask pattern includes openings formed in a line along a second direction intersecting the first direction; and
    forming the first stepped sidewalls by repeating a process of etching the second stacked group by using the trench-type mask pattern as an etching barrier and a process of widening the widths of the openings.

3. The method of claim 1, comprising:
    forming a first trench-type mask pattern over the second stacked group, wherein the first trench-type mask pattern includes first openings formed in a line along the second direction intersecting the first direction;
    forming an upper step structure constituting an upper portion of each of the first stepped sidewalls by repeating a process of etching the second stacked group by using the first trench-type mask pattern as an etching barrier and a process of widening the widths of the first openings;
    shielding the upper step structure with a second trench-type mask pattern, wherein the second trench-type mask pattern includes second openings formed in a line along the second direction; and
    forming a lower step structure constituting a lower portion of each of the first stepped sidewalls by repeating a process of etching the second stacked group by using the second trench-type mask pattern as an etching barrier and a process of widening the widths of the second openings.

4. The method of claim 3, wherein a select step structure including the same number of steps as the upper step structure is simultaneously formed with the upper step structure on the first contact area adjacent to the cell area,
    wherein the select step structure is blocked by the second trench-type mask pattern.

5. The method of claim 1, wherein the etching of the second stacked group to have the depression structure includes:
    forming a hole-type mask pattern over the second stacked group, wherein the hole-type mask pattern includes opening holes each opening a pair of first stepped sidewalls opposite to each other in the first direction;
    forming second stepped sidewalls by etching the second stacked group by using the hole-type mask pattern as an etching barrier such that the first stepped sidewalls are moved down to the second depth; and
    performing, once or more, a depressing process including a process of widening the areas of the opening holes and a process of etching the second stacked group by using the hole-type mask pattern as an etching barrier such that the second stepped sidewalls are moved down to the third depth, and the first stepped sidewalls having the first depth, which remain around the second stepped sidewalls, are moved down to the second depth.

6. The method of claim 5, wherein the opening holes are arranged in zigzag along the first direction.

7. The method of claim 5, wherein the opening holes adjacent to each other in the second direction intersecting the first direction are connected to each other through the process of widening the areas of the opening holes.

8. The method of claim 5, wherein the depressing process includes etching the second stacked group to a depth equal to as a difference between the second and third depths once.

9. The method of claim 5, wherein the depressing process includes etching the second stacked group to a depth less than a difference between the second and third depths twice or more.

10. The method of claim 1, wherein each of the forming of the first stacked group and the forming of the second stacked group includes alternately stacking first material layers and second material layers.

11. The method of claim 10, wherein each of the first stepped sidewalls is configured with x steps each including a pair of a first material layer and a second material layer.

12. The method of claim 11, wherein the forming of the depression structure is performed by etching the second stacked group in units of one to x+1 pairs of first material layers and second material layers.

* * * * *